United States Patent
Hotta et al.

(10) Patent No.: US 8,513,808 B2
(45) Date of Patent: Aug. 20, 2013

(54) SEMICONDUCTOR DEVICE HAVING TRENCH-ISOLATED ELEMENT FORMATION REGION

(75) Inventors: Katsuhiko Hotta, Kanagawa (JP); Takeshi Furusawa, Kanagawa (JP); Toshikazu Matsui, Kanagawa (JP); Takuro Homma, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 62 days.

(21) Appl. No.: 13/095,735

(22) Filed: Apr. 27, 2011

(65) Prior Publication Data

US 2011/0266679 A1 Nov. 3, 2011

(30) Foreign Application Priority Data

Apr. 28, 2010 (JP) ................... 2010-103362

(51) Int. Cl.
*H01L 23/522* (2006.01)
*H01L 21/768* (2006.01)
*H01L 23/525* (2006.01)

(52) U.S. Cl.
USPC ............ 257/758; 257/E23.145; 257/E21.585; 257/E23.149; 257/E23.01; 257/529; 257/734; 257/314; 257/315; 257/324; 257/751; 257/750; 257/762; 257/637; 257/642; 257/643; 257/774

(58) Field of Classification Search
USPC .................. 257/758, E23.145, E21.585, 529, 257/E23.149, 48, 619, 734, E23.01, 334, 257/314, 315, 324, 751, 750, 762, 637, 642, 257/643, 774, 773
See application file for complete search history.

(56) References Cited

U.S. PATENT DOCUMENTS

| 6,677,679 | B1 * | 1/2004 | You et al. ...................... 257/758 |
| 6,849,541 | B1 * | 2/2005 | Hu et al. ........................ 438/638 |
| 7,285,460 | B2 * | 10/2007 | Sashida ......................... 438/239 |
| 2001/0045651 | A1 * | 11/2001 | Saito et al. ................... 257/750 |
| 2006/0103025 | A1 | 5/2006 | Furusawa et al. |
| 2010/0140743 | A1 * | 6/2010 | Sashida ......................... 257/532 |
| 2010/0255675 | A1 * | 10/2010 | Kikuchi et al. ............... 438/637 |
| 2010/0327449 | A1 * | 12/2010 | Furusawa et al. ............. 257/751 |
| 2012/0038055 | A1 * | 2/2012 | Ko et al. ........................ 257/773 |
| 2012/0248613 | A1 * | 10/2012 | Hotta et al. ................... 257/751 |
| 2012/0252205 | A1 * | 10/2012 | Hotta et al. ................... 438/624 |

FOREIGN PATENT DOCUMENTS

| JP | 2006-140404 A | 6/2006 |
| JP | 2007-115988 A | 5/2007 |

* cited by examiner

*Primary Examiner* — A O Williams
(74) *Attorney, Agent, or Firm* — Miles & Stockbridge P.C.

(57) ABSTRACT

Provided is a technique capable of improving the reliability of a semiconductor device having a slit made over a main surface of a semiconductor substrate, so as to surround each element formation region. In the technique, a second passivation film covers the side surface of an opening made to make the upper surface of a sixth-layer interconnection M6 used for bonding pads naked, and the inner walls (the side surfaces and the bottom surface) of a slit made to surround the circumference of a guard ring and made in a first passivation film, an insulating film for bonding, and an interlayer dielectric, so as to cause the bottom thereof not to penetrate through a barrier insulating film.

13 Claims, 18 Drawing Sheets

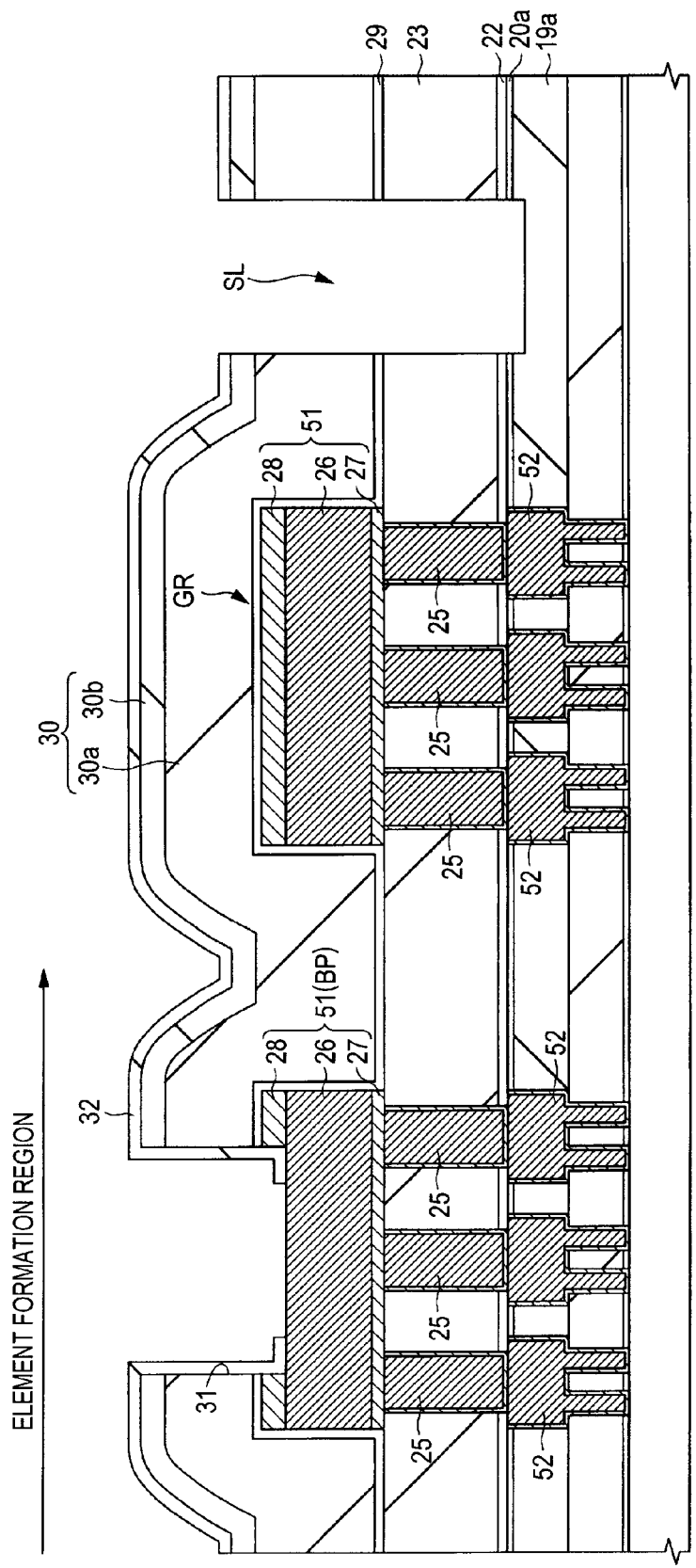

SEMICONDUCTOR DEVICE HAVING TRENCH-ISOLATED ELEMENT FORMATION REGION

CROSS-REFERENCE TO RELATED APPLICATIONS

The disclosure of Japanese Patent Application No. 2010-103362 filed on Apr. 28, 2010 including the specification, drawings and abstract is incorporated herein by reference in its entirety.

BACKGROUND

The present invention relates to a semiconductor device, and a manufacturing method of the same, in particular, semiconductor device having a slit made over a main surface of a semiconductor substrate so as to surround an element formation region for the purpose of preventing an interlayer dielectric, an interconnection and some other from being peeled or cracked, and a method useful for manufacturing the device.

For example, Japanese Unexamined Patent Publication No. 2007-115988 (Patent document 1) discloses a semiconductor device having the following members: an interlayer dielectric in which a first non-low-k film having a dielectric constant larger than 3.5, a low-k film having a dielectric constant of 3.5 or less, and a second non-low-k film having a dielectric constant larger than 3.5 are successively laminated upwards; a sealing formed to surround an element formation region; a trench pattern arranged outside the sealing and made in the second non-low-k film; and a passivation film covering the inner walls of the trench pattern.

Japanese Unexamined Patent Publication No. 2006-140404 (Patent document 2) discloses a semiconductor device having a low-dielectric-constant film inside which a copper interconnection is formed, an interlayer dielectric arranged over the low-dielectric-constant film, a surface protecting film arranged over the interlayer dielectric, a sealing formed to surround the circumference of a circuit formation region, and a trench which is made outside the sealing as viewed from the above, in which the bottom of the trench is formed above the low-dielectric-constant and below the upper end of the copper interconnection.

BACKGROUND ART DOCUMENTS

Patent Documents

Patent document 1: Japanese Unexamined Patent Publication No. 2007-115988
Patent document 2: Japanese Unexamined Patent Publication No. 2006-140404

SUMMARY

In a dicing step of cutting a semiconductor wafer into the form of chips, there is caused a problem that various films thereon are peeled or cracked, examples of the films including a low-k film (an insulating film having a dielectric constant of 3.5 or less) comprised of an interlayer dielectric, a BPSG (boron-doped phosphor silicate glass) film, which is smaller in mechanical strength than silicon oxide films, and a silicon nitride film, which is higher in film stress than silicon oxide films. Thus, as disclosed in Patent documents 1 and 2 described above, suggested is a method for solving the problem by making a slit (such as a trench or a trench pattern) over a main surface of a semiconductor substrate to surround each element formation region so as to isolate the element formation region and any dicing region from each other.

However, the inventors have investigated to make it evident that in a semiconductor device having a copper interconnection formed by the damascene process, at the time when the bottom of a slit made to surround each element formation region reaches a low-k film in which an interconnection trench, where the copper interconnection is to be buried, is formed, water invades the element formation region through the slit. When the water invades the element formation region, there is caused, for example, a problem that in a reliability test for the semiconductor device, the copper interconnection in the element formation region corrodes so that the reliability of the semiconductor device deteriorates.

An object of the invention is to provide a technique making it possible to improve the reliability of a semiconductor device having a slit made over a main surface of a semiconductor substrate to surround an element formation region.

The object of the invention, other objects thereof, and new features thereof will be made evident from the description of the present specification, and the attached drawings.

Of all aspects of the invention disclosed in the present application, two typical aspects are briefly as follows:

One of the typical aspects is a semiconductor device including a first insulating film formed over a semiconductor substrate, an interconnection trench made in the first insulating film, a first interconnection formed inside the interconnection trench and including a first conductive film containing copper as a main conductive material, a second insulating film formed over the first interconnection and the first insulating film and having a first thickness, a third insulating film formed over the second insulating film and having a second thickness larger than the first thickness, a plug formed in the second and third insulating films to be coupled with the first interconnection and including a main conductive material different from that of the first conductive film, a second interconnection formed to be coupled with the plug and including a main conductive material different from that of the first conductive film, a first passivation film formed to cover the second interconnection and the third insulating film, an opening made in the first passivation film to make the upper surface of the second interconnection naked, a slit (such as a trench or a trench pattern) made in the third insulating film and the first passivation film and between an element formation region and a dicing region, and a second passivation film formed to cover any side surface of the opening, in which the bottom of the trench does not penetrate through the third insulating film in the film thickness direction of the third insulating film.

The other aspect is a manufacturing method of a semiconductor device, including the step of forming an insulating film for interconnection formation over a main surface of a semiconductor substrate, the step of making an interconnection trench in the interconnection-forming insulating film, and burying, into the interconnection trench, a first interconnection including a first conductive film containing copper as a main conductive material, the step of forming, over the first interconnection and the interconnection-forming insulating film, a barrier insulating film and an interlayer dielectric, the step of working the interlayer dielectric and the barrier insulating film successively to make a coupling hole reaching the first interconnection, the step of forming a plug inside the coupling hole, the step of forming a second interconnection coupled with the plug, the step of forming a first passivation film to cover the second interconnection and the interlayer dielectric, the step of working the first passivation film and the interlayer dielectric successively to make an opening through which the upper surface of the second interconnection is naked, and making a slit (such as a trench or a trench pattern between an element formation region and a dicing region, the step of forming a second passivation film over the upper surface of the first passivation film, any side surface and the bottom surface of the opening, and any side surface and the bottom surface of the slit, these surfaces being named so when viewed from the above, and the step of covering the upper surface of the first passivation film, the side surface of the opening, and the side surface and the bottom surface of the slit, these surfaces being named so when viewed from the above, with a resist pattern, and etching the second passivation film over the bottom surface of the opening, the second passivation film being uncovered with the resist pattern.

Advantageous effects obtained by these aspects are briefly as follows:

An improvement is made in the reliability of a semiconductor device having a slit made over a main surface of a semiconductor substrate so as to surround an element formation region.

BRIEF DESCRIPTION OF THE DRAWINGS

FIG. 18 is a partial sectional view of upper-layer interconnections in one out of element formation regions and a slit region adjacent to the region in an example of an interconnection structure investigated by the inventors before the present invention has been made.

DETAILED DESCRIPTION

Figure 1:
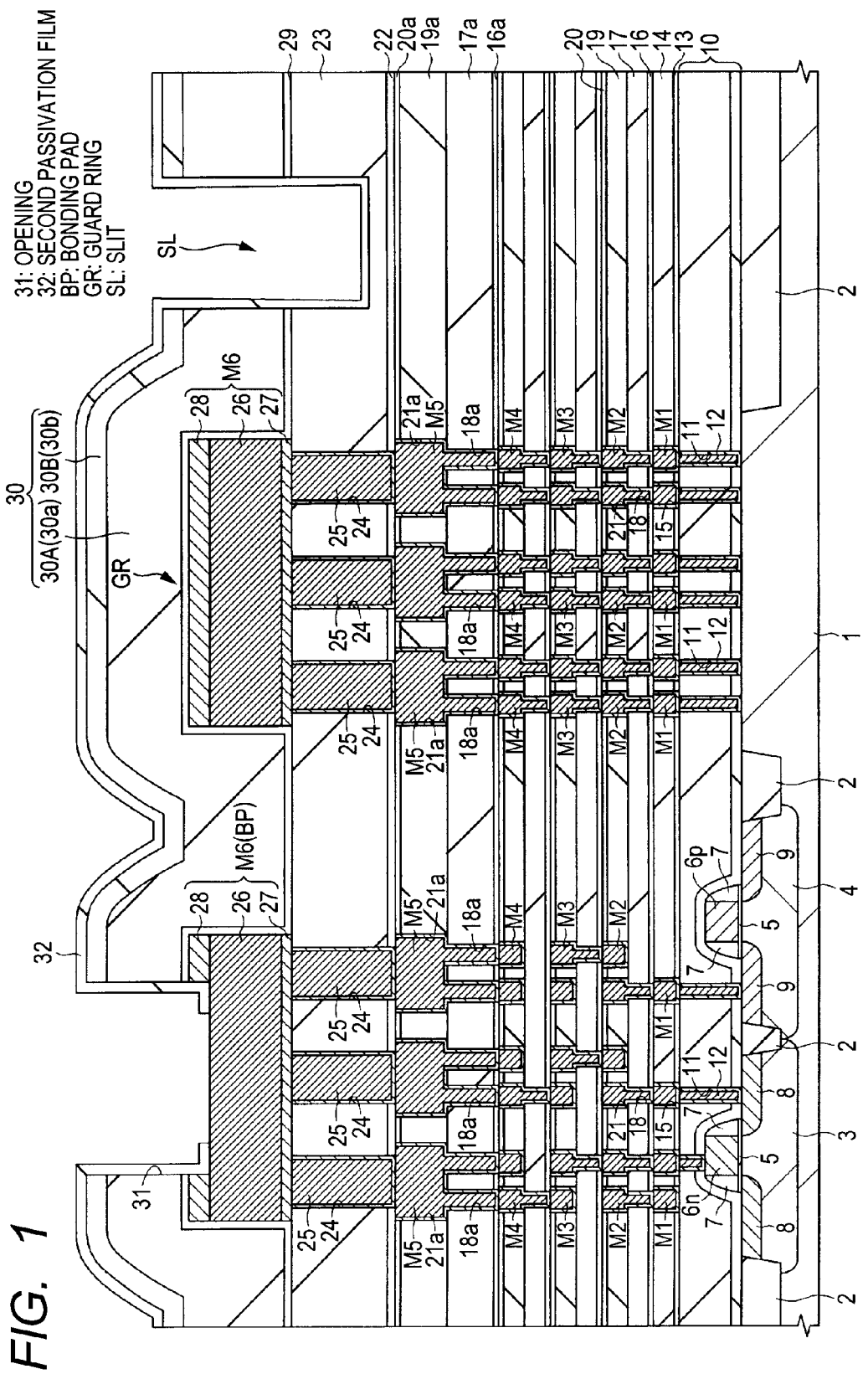
FIG. 1 is a partial sectional view of a semiconductor device according to a first embodiment of the invention.

In the following description, for the sake of convenience, the present invention may be divided into plural sections or plural embodiments as the need arises, so as to be described in accordance with the sections or embodiments. However, these are not independently of each other; thus, any one thereof may be a modified example, details, a supplement for explanation, or some other of a part or the whole of the other or another except any case where it is evidently stated that such a matter is denied.

In the case of referring, in the following description, to a specific numerical value for representing the number of elements, the quantity of an element, the lower or upper limit of any range, or any other, the element-number or the other is not limited to the specific numerical value, and may be a numerical value above or below the specific numerical value except any case where it is evidently stated that this matter is denied, any case where the element-number or the other is theoretically limited to the specific numerical value, or some other case. Furthermore, in the following description, any constituent, any process-constituting step, or the like is not necessarily essential except any case where it is evidently stated that this matter is denied, any case where the constituent or the other is theoretically essential, or some other case. In the same way, in the case of referring, in the following description, to the shape of constituents, the positional relationship therebetween, or the like, any shape or, other that is equivalent or similar to the shape or the other is allowable in the invention except any case where it is evidently stated that this matter is denied, any case where this matter is evidently denied in principle, or some other case. Such a matter should be applied to the above-mentioned specific numerical value in the invention.

Even when any one of the drawings referred to in the following description is a plan view, some region therein may be hatched in order to make the understanding of the view easy. In the following description, an MISFET (metal insulator semiconductor field effect transistor), which is a typical example of a field effect transistor, is abbreviated as an MIS (the word "metal" denotes an electroconductor such as polycrystalline silicon as well as a metal). In the following description, the word "wafer" mainly denotes a silicon monocrystal wafer, and further denotes any SOI (silicon on insulator) wafer, any insulating film substrate on which an integrated circuit is to be formed, or some other. The shape thereof is not limited, and may be, for example, a circle, any shape equivalent to a circle, a square, or a rectangle. In the following description, the word "silicon nitride" denotes $Si_3N_4$ of course, and further denotes any nitride of silicon that has a composition similar to $Si_3N_4$.

In all the drawings referred to in the following description, in principle, the same reference numbers are attached to the same members or portions; thus, repeated description is omitted. Hereinafter, embodiments of the invention are described in detail with reference to the drawings.

First, in order to make a semiconductor device and/or a method for manufacturing the device according to each of the embodiments of the invention more evident, a description is made about a cause that Cu (copper) interconnections are corroded, which has been investigated by the inventors for comparison with the invention.

Referring to FIG. 18, a description is made about a multi-layered (multi level) interconnection structure investigated by the inventors before the present invention has been made. FIG. 18 is a sectional view of upper-layer interconnections in one out of element formation regions, and a slit region adjacent thereto in an example of the structure.

As illustrated in FIG. 18, an interconnection 51 of a top layer is comprised of the following three members: a conductive film 26 containing, for example, Al (aluminum) as a main conductive material, this film being to be referred to as the Al film 26 hereinafter; and TiN (titanium nitride) films 27 and 28 that are formed on the lower and upper surfaces of the film 26, respectively, in order to improve the EM (electro-migration) resistance thereof. The TiN film 28 formed on the upper surface of the Al film 26 also has a function of an antireflection film.

The top-layer interconnection 51 is covered with an insulating film 29 for bonding, and a first passivation film 30. The bonding insulating film 29 is laid to prevent the first passivation film 30 from being peeled. The first passivation film 30 is comprised of, for example, a silicon oxide film 30a formed by high-density plasma CVD, and a silicon nitride film 30b formed by plasma CVD. The film 30 has a function as a protecting film for preventing the invasion of water or impurities from the outside, and restraining the penetration of α-rays.

In the element formation region, openings, a typical example of which is an opening 31, are made in the TiN film 28 as the top layer of the top-layer interconnection 51, which is used for bonding pads BP, the bonding insulating film 29, and the first passivation film 30. The Al film 26 of the top-layer interconnection 51 is exposed to the bottom surface of the opening 31. Furthermore, the upper surface of the first passivation film 30 and the side surface of the opening 31, these surfaces being named or classified so when viewed from the above, are covered with a second passivation film 32. The upper surface of the top-layer interconnection 51 used for the bonding pads BP is not covered with the second passivation film 32, so as to be naked in order to couple the interconnection 51 with external terminals (such as bonding wires or bump).

A guard ring (sealing) GR is formed to surround the element formation region. A slit (such as a trench or a trench pattern) SL is formed to surround the circumference of the guard ring GR.

However, the inner walls of the slit SL are uncovered. Furthermore, this slit SL is made in the second passivation film 32, the first passivation film 31, the bonding insulating film 29, and the interlayer dielectric 23. However, by a variation in the precision in working for making the slit SL or some other factor, the slit SL may be made into a deeper position so that the bottom of the slit SL may reach a barrier insulating film 22, a cap insulating film 20a, and an insulating film 19a for interconnection formation, each of which is below the interlayer dielectric 23. The interconnection-forming insulating film 19a is mainly a low-k film in order to make the parasitic capacitance of an interconnection to be formed small. However, the low-k film is poorer in humidity resistance than insulating films made of $SiO_2$, so that the low-k film permits an easy invasion of water.

In order to prevent the diffusion of any interconnection material, the bottom of the slit SL can be located not to reach the interconnection-forming insulating film 19a by forming the barrier insulating film 22, which is laid between the interlayer dielectric 23 and the interconnection-forming insulating film 19a, so as to have a large thickness. However, the barrier insulating film 22 is usually made of nitrogen-containing silicon, such as SiN (silicon nitride), SiCN (silicon carbonitride) or SiON (silicon oxynitride), and the dielectric constant thereof is higher than that of $SiO_2$. For this reason, when the barrier insulating film 22 is made thick, the parasitic capacitance of the interconnection to be formed becomes large so that an element to be manufactured is hindered from being operated at a high speed.

Next, the present invention will be described in detail by way of first, second, and third embodiments thereof.

First Embodiment

Figure 2:
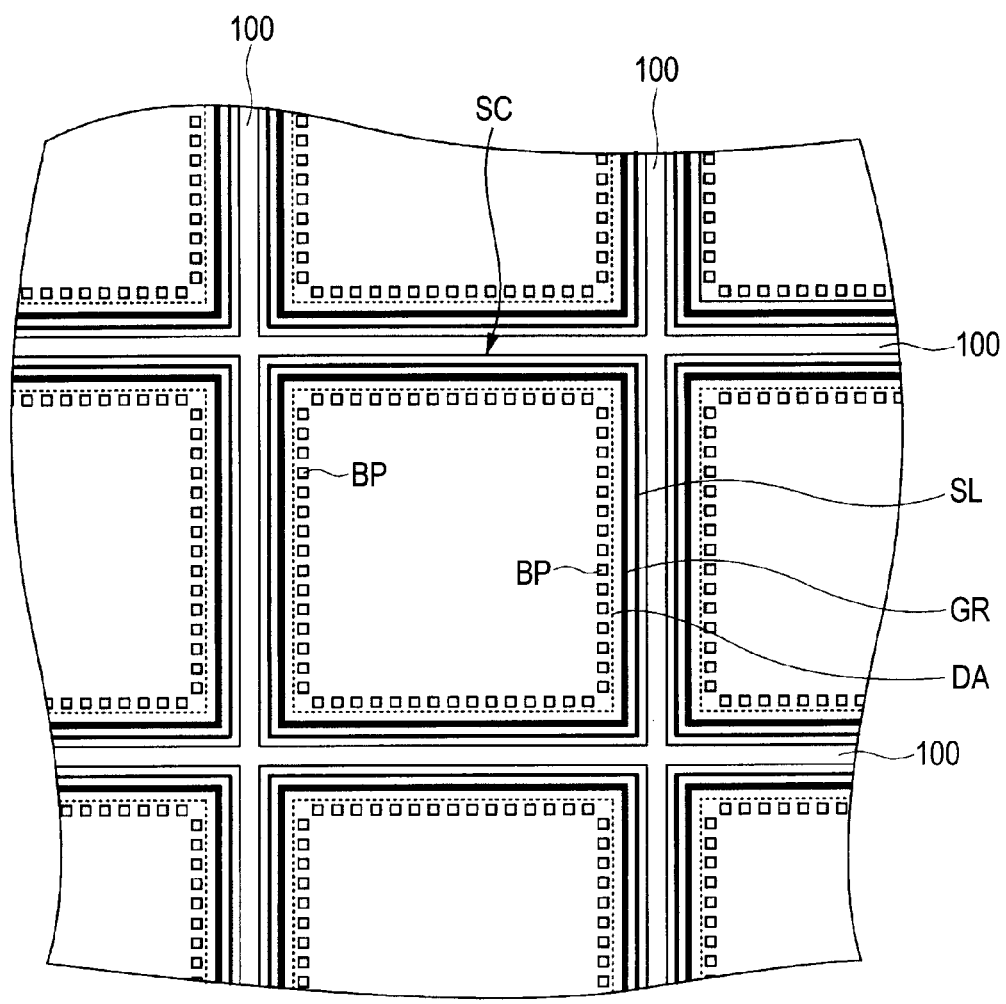
FIG. 2 is a partial plan view of the semiconductor device.

With reference to FIGS. 1 and 2, a semiconductor device according to the first embodiment is described hereinafter. FIG. 1 is a partial sectional view of the semiconductor device, and FIG. 2 is a partial plan view of the device.

As illustrated in FIG. 1, a semiconductor device comprised of various desired semiconductor elements is formed in/over a main surface of a semiconductor substrate (semiconductor wafer worked in the form of a circular thin plate) made of a silicon monocrystal, so as to be assigned to each of divided semiconductor chips in the main surface. Examples of the semiconductor elements include CMOS (complementary metal oxide semiconductor) devices, resistance elements, and capacitance elements. In the first embodiment, CMOS devices are given as examples. A p-channel MISFET which configures a CMOS device is abbreviated as a pMIS, and an n-channel MISFT which configures a CMOS is abbreviated as an nMIS.

In each element formation region of the semiconductor substrate 1, an isolating region 2 made of an insulating film is formed. A p well 3 is formed by ion-implanting a p-type conductive impurity into each first region of the semiconductor substrate 1, and an n well is formed by ion-implanting an n-type conductive impurity onto each second region, which is different from each of the first regions. Each nMIS is comprised of, for example, a gate insulating film 5 formed on the front surface of the semiconductor substrate 1 (the p well 3), a gate electrode 6n formed on the gate insulating film 5, a side wall 7 formed on the side surface of the gate electrode 6n, and an n-type semiconductor region 8 which is formed in the semiconductor 1 (the p well 3) and at both sides of the gate electrode 6n, and which functions as a source and a drain. Similarly, each pMIS is comprised of, for example, the gate insulating film 5 formed on the front surface of the semiconductor substrate 1 (the p well 4), a gate electrode 6p formed on the gate insulating film 5, a side wall 7 formed on the side surface of the gate electrode 6p, and a p-type semiconductor region 9 which is formed in the semiconductor 1 (the n well 4) and at both sides of the gate electrode 6n, and which functions as a source and a drain.

Furthermore, the nMIS and pMIS are covered with an interlayer dielectric 10. Coupling holes 11 are made in this interlayer dielectric 10 so as to reach required portions over the n-type semiconductor regions 8, the p-type semiconductor regions 9, and some other. Inside each of the coupling holes 11, a plug 12 is buried which is made of a conductive film containing W (tungsten) as a main conductive material. An interconnection M1 of a first layer is formed to be coupled with the plug 12. The first-layer interconnection M1 is, for example, a conductive film containing Cu as a main conductive material, and is formed by the single damascene process. In other words, each interconnection trench 15 is made in a laminated film comprised of a stopper insulating film 13 and an insulating film 14 for interconnection formation, and the first-layer interconnection M1, which is a conductive film containing Cu as a main conductive material, is buried in the interconnection trench 15.

Furthermore, over the first-layer interconnection M1, the following are made: interconnections from an interconnection M2 of a second layer to an interconnection M6 of a sixth layer. The second-layer interconnection M2 to the fifth-layer interconnection M5 are each, for example, a conductive film containing Cu as a main conductive material, and are each formed by the dual damascene process. The sixth-layer interconnection M6 is, for example, a patterned conductive film containing Al as a main conductive material. The interconnection M6 is formed by working a conductive film containing Al as a main conductive material and deposited on the semiconductor substrate 1 by use of a resist pattern as a mask. The sixth-layer interconnection M6 partially functions as bonding pads BP.

The interconnections from the first- to the sixth-layer interconnections M1 to M6 are formed in each of the element formation regions, and are used for the operation of concerned circuits. Furthermore, as illustrated in FIG. 2, a guard ring GR having a laminated structure comprised of the interconnections from the first- to the sixth-layer interconnections M1 to M6 is formed to surround each element formation region DA as each of the above-mentioned element formation regions. Furthermore, a slit SL is made to surround the guard ring GR. Specifically, the guard ring GR and the slit SL are formed between each of the element formation regions, and scribe lines 100 through which the semiconductor wafer is to be cut into semiconductor chips SC. In the first embodiment, the number of the interconnection layers is 6; however, the number of interconnection layers is not limited thereto.

The second-layer interconnection M2 is formed to be integrated with a coupling member for coupling the second-layer interconnection M2 with the first-layer interconnection M1, which is laid beneath the interconnection M2. The second-layer interconnection M2 and the coupling member, which are integrated with each other so as to be formed as a conductive film containing Cu as a main conductive material, are buried in coupling holes 18, which are made in a laminated film comprised of a stopper insulating film 16 and an interlayer dielectric 17, and buried in interconnection trenches 21, which are made in a laminated film comprised of an insulating film 19 for interconnection formation and a cap insulating film 20.

The stopper insulating film 16 is made of a material having a smaller etch rate than that of the material of the interlayer dielectric 17, and is, for example, a silicon nitride film formed by plasma CVD. Furthermore, the stopper insulating film 16 has a function as a protecting film for preventing the diffusion of Cu comprised of the first-layer interconnection M1. The interlayer dielectric 17 is, for example, a TEOS (tetraethyl orthosilicate) film formed by plasma CVD. The interconnection-forming insulating film 19 is an insulating film having a lower dielectric constant than $SiO_2$, and is, for example, a low-k film, which has a dielectric constant of 3.5 or less. The low-k film may be, for example, a fluorine-containing silicon oxide film. The cap insulating film 20 is, for example, a TEOS film formed by plasma CVD.

The interconnections from the third to fifth interconnections M3 to M5 each have the same structure as the second-layer interconnection M2, and are successively formed upward over the second-layer interconnection M2.

The fifth-layer interconnection M5 is covered with a barrier insulating film 22 and an interlayer dielectric 23. In these films 22 and 23, coupling holes 24 which reach the fifth-layer interconnection M5 are made. In each of the coupling holes 24, a plug 25 is buried which is made of a conductive film containing, for example, W as a main conductive material. The sixth-layer interconnection M6 is formed to be coupled with the plugs 25.

The barrier insulating film 22 has a function as a protecting film for preventing the diffusion of Cu, and is, for example, a nitrogen-containing silicon film, such as a SiN film; a SiCN film or a SiON film. The thickness thereof is, for example, from about 175 to 225 nm. The interlayer dielectric 23 is, for example, a silicon oxide film formed by plasma CVD. The thickness thereof is, for example, about 1000 nm.

The sixth-layer interconnection M6 is made mainly of an Al film 26, and TiN films 27 and 28 are formed on the lower and upper surfaces of the film 26, respectively, in order to improve the EM resistance. Furthermore, the TiN film 28 formed on the upper surface of the Al film 26 also has a function of an antireflection film. The Al film 26 is formed by, for example, sputtering, and the thickness thereof is, for example, about 1000 nm. The TiN films 27 and 28 formed on the lower and upper surfaces of the Al film 26, respectively, are each formed by, for example, sputtering. The thickness of the TiN film 28 formed on the upper surface of the Al film is, for example, from about 100 to 300 nm.

The sixth-layer interconnection M6 is covered with an insulating film 29 for bonding, and a first passivation film 30. The bonding insulating film 29 is, for example, a silicon oxide film formed by plasma CVD, and is laid to prevent the first passivation film 30 from being peeled. The thickness thereof is, for example, about 70 nm. The first passivation film 30 is comprised of, for example, a silicon oxide film 30a (lower-layer passivation film 30A) formed by plasma CVD, and a silicon nitride film 30b (upper-layer passivation film 30B) formed by plasma CVD. The film 30 has a function as a protecting film for preventing the invasion of water and impurities from the outside and restraining the penetration of α-rays. The thickness of the silicon oxide film 30a positioned as the lower layer of the passivation films is, for example, about 1000 nm, and that of the silicon nitride film 30b positioned as the upper layer thereof is, for example, 600 nm.

In each of the element formation regions, openings, a typical example of which is an opening 31, are made in the TiN film 28 as the top layer of the sixth-layer interconnection M6, which is used for bonding pads BP, the bonding insulating film 29 and the first passivation film 30, and the Al film 26 of the sixth-layer interconnection M6 is exposed to the bottom surface of the opening 31.

The slit SL is formed to surround the circumference of the guard ring GR. The slit SL is made in the interlayer dielectric 23 laid between the fifth-layer interconnection M5 and the sixth-layer interconnection M6, the bonding insulating film 29, and the first passivation 30. The width of the slit SL is, for example, from about 4 to 5 nm. It is desired that the bottom of the slit SL does not penetrate completely through the interlayer dielectric 23 in the film thickness direction of this film 23 so that the bottom does not reach the barrier insulating film 22, which is laid between the fifth-layer interconnection M5 and the sixth-layer interconnection M6 and functions as a protecting film for preventing the diffusion of Cu. However, by a variation in the precision of working for making the slit SL, or some other factor, the bottom of the slit SL may reach the barrier insulating film 22. However, it is sufficient for the slit SL that the following is not caused: the bottom of the slit SL penetrates through the barrier insulating film 22 in the film thickness direction of this film 22 to reach a cap insulating film 20a (for example, an insulating film made of the same material as used for the cap insulating film 20) as a layer beneath the film 22. This is based on the following reason: an insulating film 19a for interconnection formation (for example, an insulating film made of the same material as used for the interconnection-forming insulating film 19) contains fluorine so that the humidity resistance of this film 19a is poorer than that of any insulating film containing no fluorine; therefore, if the bottom of the slit SL reaches the cap insulating film 20a to further reach the interconnection-forming insulating film 19a laid beneath the film 20a, the invasion of water through the slit SL is easily caused so that the Cu interconnections formed in each of the element formation regions is corroded. In FIG. 1, reference number 16a represents a stopper insulating film made of the same material as used for the stopper insulating film 16; 17a, an interlayer dielectric made of the same material as used for the interlayer dielectric 17; 18a, coupling holes made in the same manner as used for making the coupling holes 18; and 21a, interconnection trenches made in the same manner as used for making the interconnection trenches 21.

Furthermore, a second passivation film 32 covers the upper surface of the first passivation film 30, the side surface of the opening 31, which is made to make the upper surface of the sixth-layer interconnection M6 naked (or uncovered), and the inner walls (the side surfaces and the bottom surface) of the slit SL, these surfaces being named or classified so when viewed from the above. The upper surface of the sixth-layer interconnection M6 used for the bonding pads BP is not covered with the second passivation film 32 so as to be naked for the purpose of being coupled with external terminals (such as bonding wires or bumps). The second passivation film 32 is, for example, a silicon nitride film formed by plasma CVD, and the thickness thereof is, for example, from about 100 to 300 nm.

By covering the inner walls (the side surfaces and the bottom surface) of the slit SL completely with the second passivation film 32, the invasion of water into the concerned element formation region through the slit SL can be further prevented. In other words, the invasion of water can be prevented by the formation of the slit SL for causing the bottom thereof not to penetrate through the barrier insulating film 22, and additionally the water-invasion can be further prevented by the covering of the inner walls (the side surfaces and the bottom surface) of the slit SL with the second passivation film 32. In this manner, in a reliability test for the semiconductor device, the Cu interconnections are not corroded by the water-invasion into the element formation region through the slit SL, so that a fall in the reliability of the semiconductor device can be prevented.

Moreover, the side surface of the opening 31 made to make the upper surface of the sixth-layer interconnection M6 used for the bonding pads BP naked is covered with the second passivation film 32, and the TiN film 28 formed on the upper surface of the Al film 26 is not naked. Accordingly, this TiN film 28 is not easily oxidized so that the volume of the TiN film 28 is not easily expanded through oxidization. Thus, the first passivation film 30, the interlayer dielectric 23 or some other is not cracked. In this manner, in a reliability test for the semiconductor device, the Cu interconnections are not corroded by the water-invasion into the element formation region through the slit SL, so that a fall in the reliability of the semiconductor device can be prevented.

The following will describe a method for manufacturing the semiconductor device according to the first embodiment in accordance with the order of steps thereof with reference to FIGS. 3 to 11, which are each a partial sectional view of the semiconductor or a workpiece thereof. FIGS. 6 to 11 are, more specifically, each a partial sectional view illustrating upper-layer interconnections (corresponding to the above-mentioned fifth- and sixth-layer interconnections M5 and M6) of the semiconductor device or the workpiece.

Figure 3:
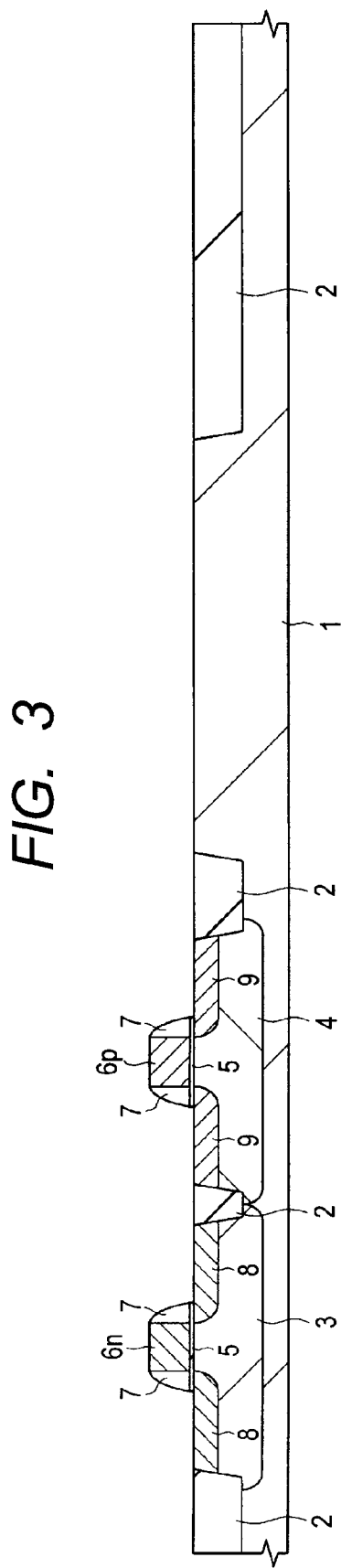
FIG. 3 is a partial sectional view of a workpiece of the semiconductor device to illustrate a step in a method for manufacturing this device.

As illustrated in FIG. 3, desired semiconductor elements are formed on/in a semiconductor substrate 1 (semiconductor wafer worked in the form of a circular thin plate) made of a silicon monocrystal. The illustrated semiconductor elements are CMOS devices as examples.

Specifically, an insulating region 2 made of an insulating film is formed in each element isolating region of a semiconductor substrate 1, and then a p-type conductive impurity is ion-implanted into the semiconductor substrate 1 to make a p well 3. Similarly, an n-type conductive impurity is ion-implanted into the substrate 1 to make an n well 4. Subsequently, a gate insulating film 5 and gate electrodes 6n and 6p, which are to constitute an nMIS and pMIS, are formed, and further side walls 7 are formed onto side surfaces of the gate electrodes 6n and 6p. Subsequently, an n-type conductive impurity is ion-implanted into the p well 3 and at both sides of the gate electrode 6n so as to form n-type semiconductor regions 8, which function as a source and a drain of the nMIS, respectively, in the manner of self-alignment with the gate electrode 6n and concerned ones of the side walls 7. Similarly, a p-type conductive impurity is ion-implanted into the n well 4 and by both sides of the gate electrode 6p so as to form p-type semiconductor regions 9, which function as a source and a drain of the pMIS, respectively, in the manner of self-alignment with the gate electrode 6p and concerned ones of the side walls 7.

Next, multi-level interconnections are formed, through which the various semiconductor elements formed in/on the main surface of the semiconductor substrate 1 are electrically coupled with each other.

Figure 4:
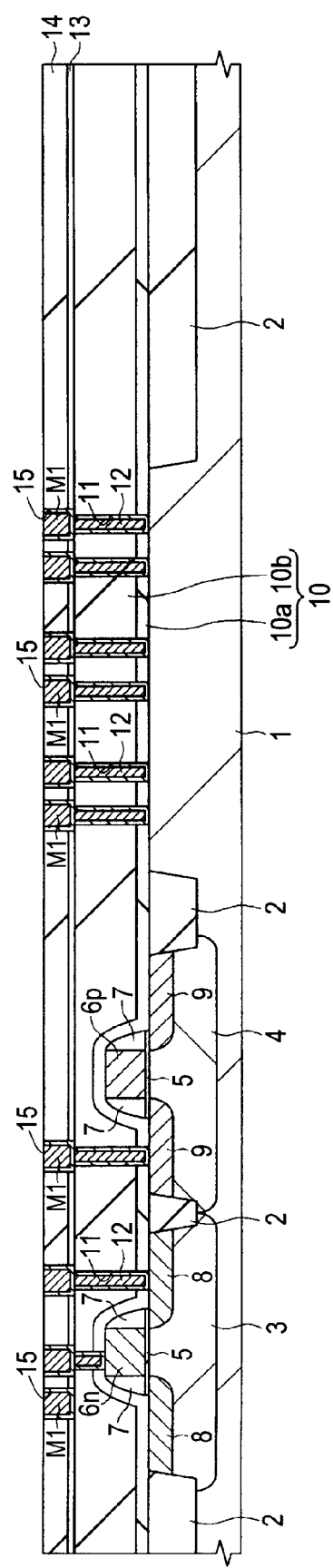
FIG. 4 is a sectional view of the same regions as illustrated in FIG. 3 in a step subsequent to the step illustrated in FIG. 3.

Specifically, as illustrated in FIG. 4, a silicon nitride film is deposited onto the main surface of the semiconductor substrate 1 by CVD to form a lower-layer insulating film 10a. Subsequently, a TEOS film is deposited onto the lower-layer insulating film 10a by plasma CVD to form an upper-layer insulating film 10b. In this way, an interlayer dielectric 10 is formed which is comprised of the lower-layer insulating film 10a and the upper-layer insulating film 10b. Thereafter, the front surface of the upper-layer insulating film 10b is polished by CMP (chemical mechanical polishing). Even when irregularities are formed in the front surface of the lower-layer insulating film 10a because of steps of the underlying substrate, the polishing of the front surface of the upper-layer insulating film 10b by the CMP makes the front surface of the interlayer dielectric 10 flat and smooth.

Next, a resist pattern is used as a mask to etch the interlayer dielectric 10, so as to make, at predetermined positions, coupling holes 11 each reaching the source or the drain of the nMIS or the pMIS, or some other. Subsequently, a barrier metal film is formed over the main surface of the semiconductor substrate 1. The barrier metal film is, for example, a Ti film or a TiN film. Furthermore, a metal film such as a W film is deposited onto the barrier metal film. The metal film and the barrier metal film are polished by, for example, CMP so as to bury the barrier metal film and the metal film into the coupling holes 11. In this way, plugs 12 containing the metal film as a main conductive film are formed.

Next, over the main surface of the semiconductor substrate 1 are successively formed a stopper insulating film 13 and an insulating film 14 for interconnection formation. The stopper insulating film 13 is a film which is to function as an etching stopper at the time of making interconnection trenches 15 in the interconnection-forming insulating film 14. The stopper insulating film 13 is made of a material having a smaller etch rate than that of the material of the interconnection-forming insulating film 14. The stopper insulating film 13 is, for example, a silicon nitride film formed by plasma CVD. The interconnection-forming insulating film 14 is, for example, a silicon oxide film formed by plasma CVD.

Next, an interconnection M1 of a first layer is formed by the damascene process.

Specifically, the interconnection trenches 15 (described just above) are first made in predetermined regions of the stopper insulating film 13 and the interconnection-forming insulating film 14 by dry etching using a resist pattern as a pattern. Thereafter, a barrier metal film is formed over the main surface of the semiconductor substrate 1. The barrier metal film is, for example, a TiN film, a Ta film or a TaN film. Subsequently, a Cu seed layer is formed on the barrier metal film by CVD or sputtering, and further an electroplating method is used to form a Cu plating layer on the Cu seed layer. The Cu plating layer is buried in the interconnection trenches 15. Subsequently, in any region other than the region of the interconnection trenches 15, the Cu plating film, the Cu seed layer and the barrier metal film are removed by, for example, CMP, so as to form, as the first-layer interconnection M1, an interconnection containing the Cu film as a main conductive film inside the interconnection trenches 15.

Next, interconnections from second- to the fifth-layer interconnections M2 to M5 are formed by the dual damascene process.

Figure 5:
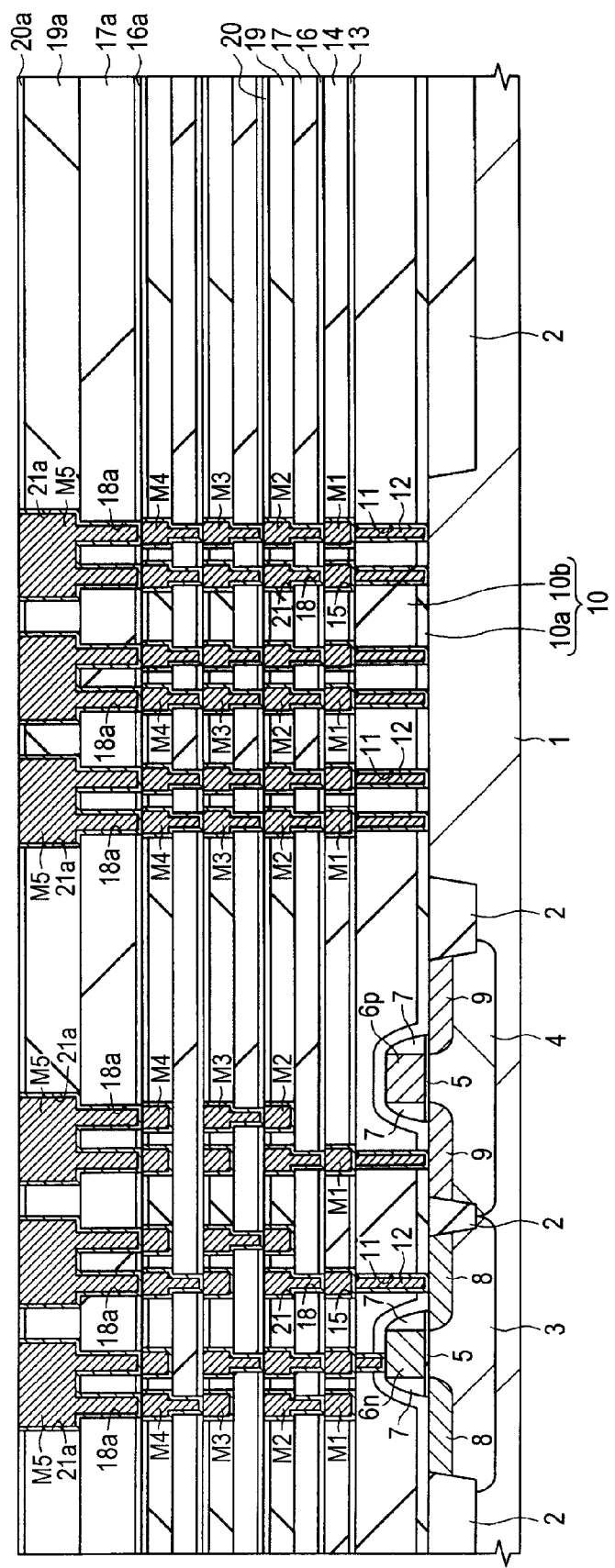
FIG. 5 is a sectional view of the same regions in a step subsequent to the step illustrated in FIG. 4.

Specifically, as illustrated in FIG. 5, a stopper insulating film 16, an interlayer dielectric 17, an insulating film 19 for interconnection formation, and a cap insulating film 20 are successively formed over the main surface of the semiconductor substrate 1. As will be described later in more detail, coupling holes 18 are to be made in the stopper insulating film 16 and the interlayer dielectric 17, and interconnection trenches 21 are to be made in the interconnection-forming insulating film 19 and the cap insulating film 20.

The stopper insulating film 16 is made of a material having a smaller etch rate than that of the material of the interlayer dielectric 17, and is, for example, a silicon nitride film formed by plasma CVD. Furthermore, the stopper insulating film 16 has a function as a protecting film for preventing the diffusion of Cu comprised of the first-layer interconnection M1. The interlayer dielectric 17 is, for example, a TEOS film formed by plasma CVD. The interconnection-forming insulating film 19 is an insulating film having a lower dielectric constant than $SiO_2$, and is, for example, a low-k film, which has a dielectric constant of 3.5 or less. The low-k film may be, for example, a fluorine-containing silicon oxide film. The cap insulating film 20 is, for example, a TEOS film formed by plasma CVD.

Next, the cap insulating film 20, the interconnection-forming insulating film 19, the interlayer dielectric 17 and the stopper insulating film 16 are successively worked by etching using, as a mask, a resist pattern for coupling-hole-formation. At this time, the stopper insulating film 16 functions as an etching stopper. Subsequently, the cap insulating film 20 and the interconnection-forming insulating film 19 are successively worked by etching using, as a mask, a resist pattern for interconnection-trench-formation. In this way, coupling holes 18 are made in the stopper insulating film 16 and the interlayer dielectric 17, and further interconnection trenches 21 are made in the interconnection-forming insulating film 19 and the cap insulating film 20.

Next, a second-layer interconnection M2 is formed inside the coupling holes 18 and the interconnection trenches 21. The second-layer interconnection M2 is comprised of a barrier metal film, and a Cu film that is a main conductive film. A coupling member is formed to be integrated with the second-layer interconnection M2, this coupling member being a member for coupling the second-layer interconnection M2 with the first-layer interconnection M1, which is an interconnection below the interconnection M2. Specifically, a barrier metal film is formed over the main surface of the semiconductor substrate 1, so that the metal film is also buried into the coupling holes 18 and the interconnection trenches 21. The barrier metal film is, for example, a TiN film, a Ta film, or a TaN film. Subsequently, a Cu seed layer is formed on the barrier metal film by CVD or sputtering, and further an electroplating method is used to form a Cu plating layer on the Cu seed layer. The Cu plating layer is buried in the coupling holes 18 and the interconnection trenches 21. Subsequently, in any region other than the regions of the coupling holes 18 and the interconnection trenches 21, the Cu plating film, the Cu seed layer and the barrier metal film are removed by, for example, CMP, so as to form, as the second-layer interconnection M2, an interconnection containing the Cu film as a main conductive film inside the interconnection trenches 21.

Thereafter, in the same way as used for forming the second-layer interconnection M2, upper-layer interconnections, i.e., interconnections from the third- to the fifth-layer interconnections M3 to M5 are further formed.

Next, a sixth-layer interconnection M6, which is an interconnection of a top-layer, is formed.

Figure 6:
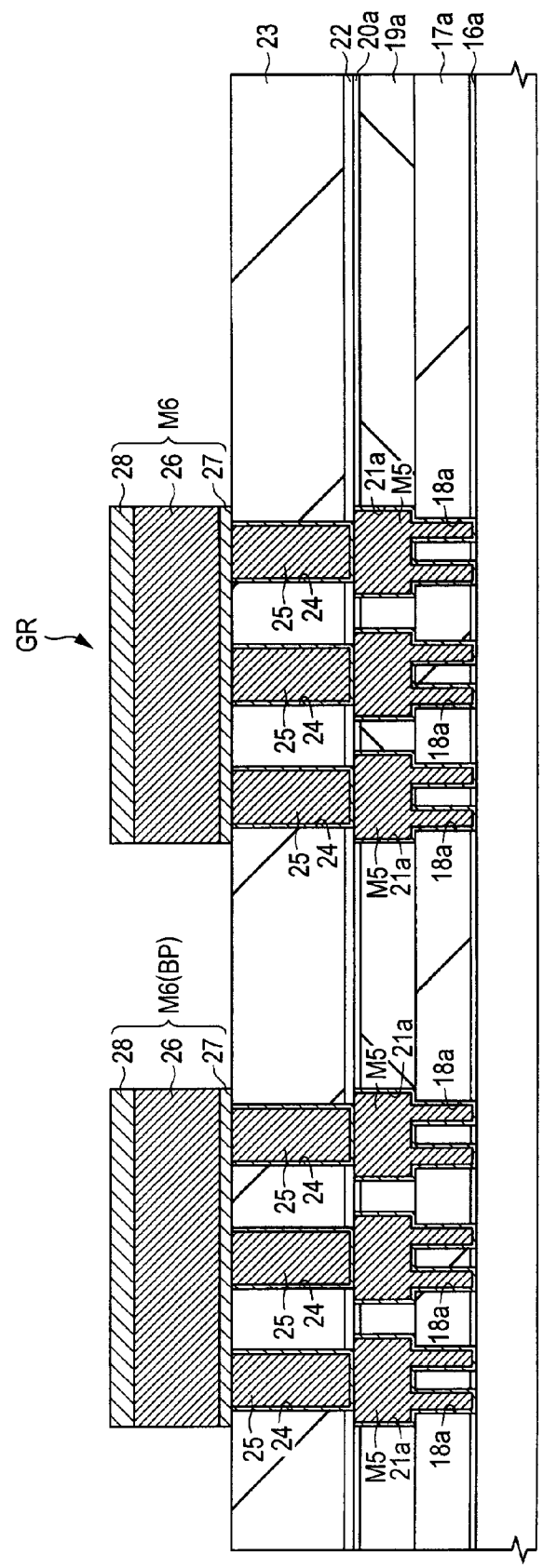
FIG. 6 is a partial sectional view illustrating upper-layer interconnections of the workpiece in a step subsequent to the step illustrated in FIG. 5.

Specifically, as illustrated in FIG. 6, a barrier insulating film 22 and an interlayer dielectric 23 are successively formed over the main surface of the semiconductor substrate 1. The barrier insulating film 22 has a function as a protecting film for preventing the diffusion of Cu, and is, for example, a nitrogen-containing silicon film, a SiCN film, or a SiON film. The thickness thereof is, for example, from about 175 to 225 nm. The interlayer dielectric 23 is, for example, a silicon oxide film formed by plasma CVD. The thickness thereof is, for example, about 1000 nm.

Next, a resist pattern is used as a mask to etch the interlayer dielectric 23 and the barrier insulating film 22 successively to make coupling holes 24 reaching the fifth-layer interconnection M5 at predetermined positions. Subsequently, a barrier metal film is formed over the main surface of the semiconductor substrate 1. The barrier metal is, for example, a Ti film or a TiN film. Furthermore, a metal film such as a W film is deposited onto the barrier metal film. The metal film and the barrier metal film are polished by, for example, CMP so as to bury the barrier metal film and the metal film into the coupling holes 24. In this way, plugs 25 containing the metal film as a main conductive film are formed.

Next, a TiN film 27, an Al film 26 and a TiN film 28 are successively formed over the main surface of the semiconductor substrate 1. The TiN films 27 and 28 formed on the lower surface and the upper surface of the Al film 26, respectively, have a function of improving the EM resistance. Furthermore, the TiN film 28 formed on the upper surface of the Al film 26 also has a function of an antireflection film. The Al film 26 is formed by, for example, sputtering, and the thickness thereof is, for example, about 1000 nm. The TiN films 27 and 28 formed on the lower and upper surfaces of the Al film 26, respectively, are each formed by, for example, sputtering. The thickness of the TiN film 28 formed on the upper surface of the Al film is, for example, from about 100 to 300 nm.

Next, the TiN film 28, the Al film 26 and the TiN film 27 are successively etched by etching using a resist pattern as a mask to form, as the sixth-layer interconnection M6, a laminated film of the TiN film 27, the Al film 26 and the TiN film 28. In the same manner as has been shown in FIG. 2, multiple bonding pads BP made of the sixth-layer interconnection M6 are formed in the circumferential region of each of the element formation regions (corresponding to the regions DAn in FIG. 2) for semiconductor chips (corresponding to the chips SC therein). Around the element formation region, a guard ring GR is formed which is made of a laminate comprised of the interconnections from the first- to sixth-layer interconnections M1 to M6.

Figure 7:
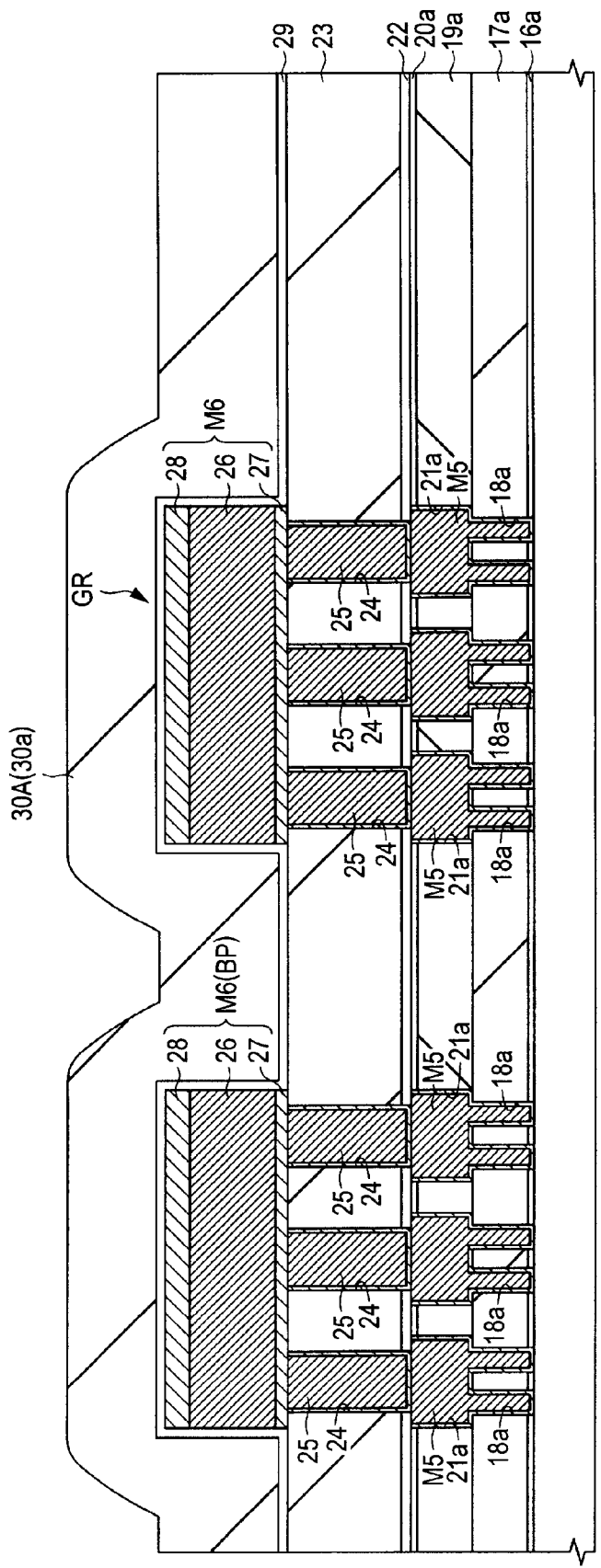
FIG. 7 is a sectional view of the same regions as illustrated in FIG. 6 in a step subsequent to the step illustrated in FIG. 6.

Next, as illustrated in FIG. 7, an insulating film 29 for bonding and a lower-layer passivation film 30A are successively formed over the main surface of the semiconductor substrate 1. The bonding insulating film 29 is, for example, a silicon oxide film formed by plasma CVD, and is laid to prevent the lower-layer passivation film 30A from being peeled. The thickness thereof is, for example, about 70 nm. The lower-layer passivation layer 30A is, for example, a silicon oxide film 30a formed by high-density plasma CVD, and the thickness thereof is, for example, about 1000 nm.

Figure 8:
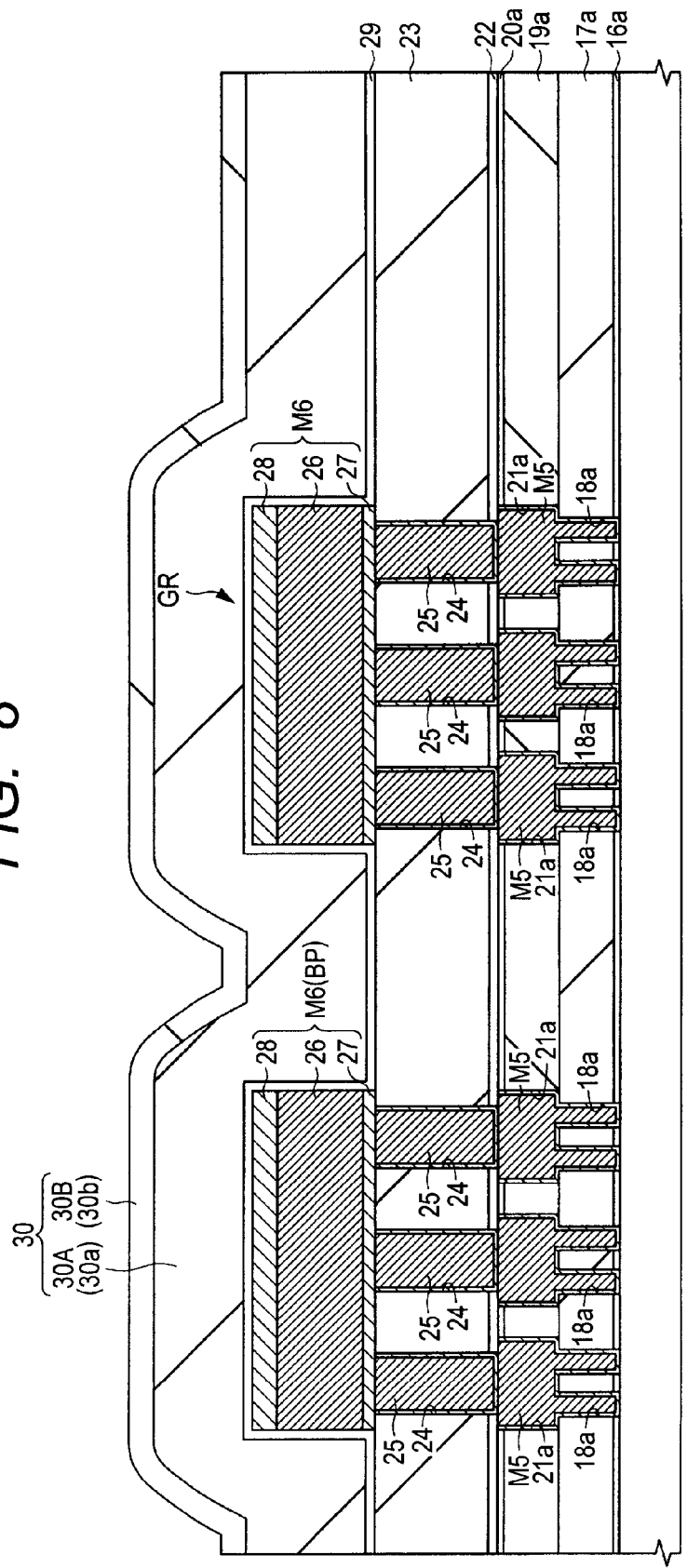
FIG. 8 is a sectional view of the same regions in a step subsequent to the step illustrated in FIG. 7.

Next, as illustrated in FIG. 8, an upper-layer passivation film 30B is formed on the lower-layer passivation film 30A. The upper-layer passivation film 30B is, for example, a silicon nitride film 30b formed by plasma CVD, and the thickness thereof is, for example, about 600 nm. The first passivation film 30, which is comprised of the lower-layer passivation film 30A and the upper-layer passivation film 30B, has a function as a protecting film for preventing the invasion of water or impurities from the outside, and restraining the penetration of α-rays.

Figure 9:
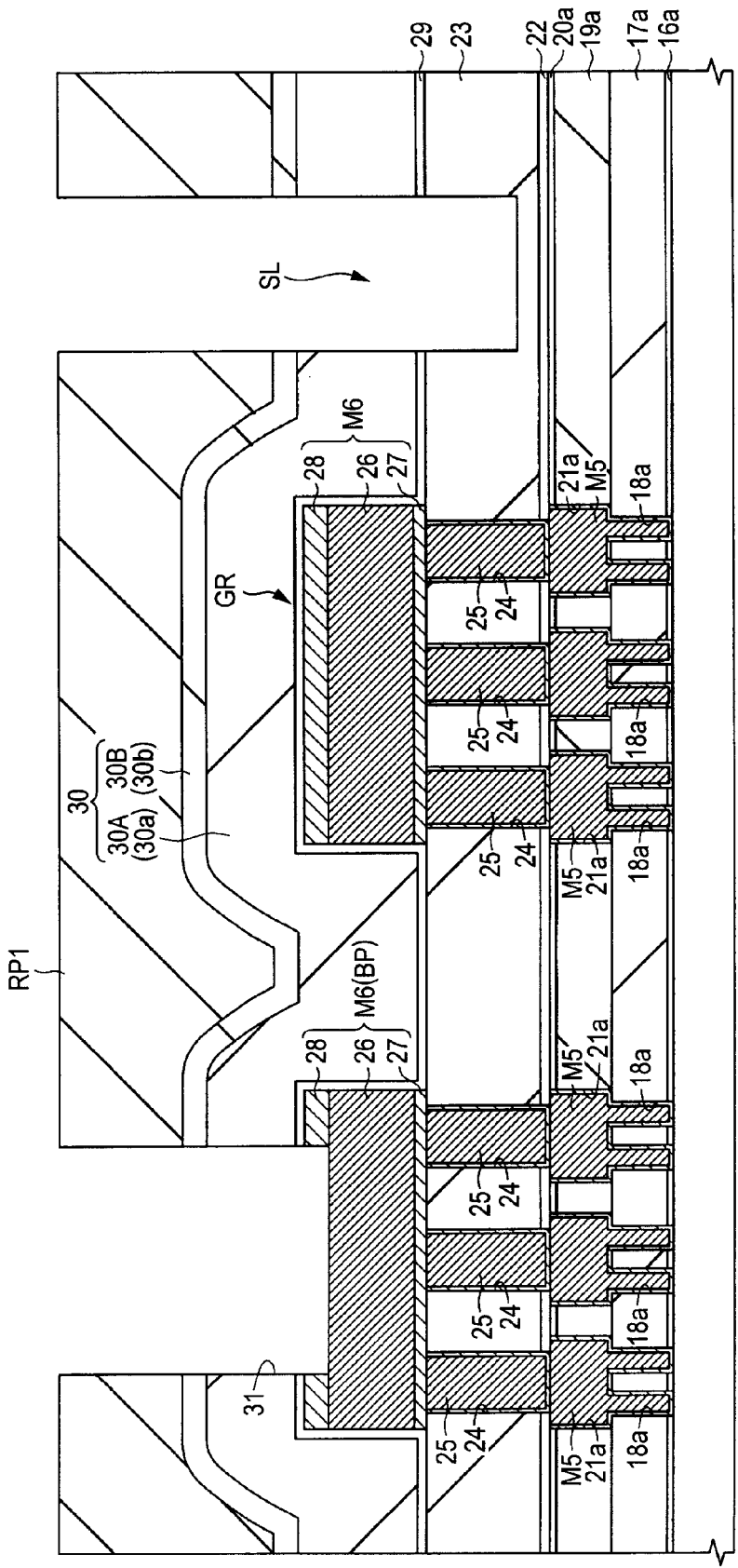
FIG. 9 is a sectional view of the same regions in a step subsequent to the step illustrated in FIG. 8.

Next, as illustrated in FIG. 9, etching using a resist pattern RP1 as a mask is utilized to etch, in each of the element formation regions, the first passivation film 30, and the TiN film 28 as the top layer of the sixth-layer interconnection M6 used for the bonding pads BP successively. Simultaneously, in a slit region (adjacent to the element formation region), the first passivation film 30, the bonding insulating film 29 and the interlayer dielectric 23 are successively etched. In this way, in the element formation region, openings, a typical example of which is an opening 31, are made. Through the opening 31, the sixth-layer interconnection M6 used for the bonding pads BP is naked, and further in the slit region, a slit SL is made. At this time, the slit SL in the slit region is formed in such a manner that the bottom thereof is located at a position where the slit SL is not permitted to penetrate through the interlayer dielectric 23 in the film thickness direction of this film 23. Accordingly, the bottom of the slit SL does not penetrate through the barrier insulating film 22 in the film thickness direction of this film 22.

The Al film 26 of the sixth-layer interconnection M6 is exposed to the bottom surface of the opening 31. The TiN film 28 formed on the upper surface of the Al film 26 is also exposed to the side surface of the opening 31. As described above, about the slit SL, the depth thereof is varied by a variation in the precision in working for making the slit SL, or some other factor; thus, the bottom of the slit SL may reach the barrier insulating film 22. However, at worst, the bottom of the slit SL is kept in the barrier insulating film 22 so that the slit SL does not penetrate through the barrier insulating film 22. When the slit SL is made deep, the following defects and other defects may be caused: the coverage of a second passivation film 32 which is to be formed in a subsequent step becomes bad; the covering performance of a resist used to work the second passivation film 32 becomes bad; and the resist remains partially without being removed.

Figure 10:
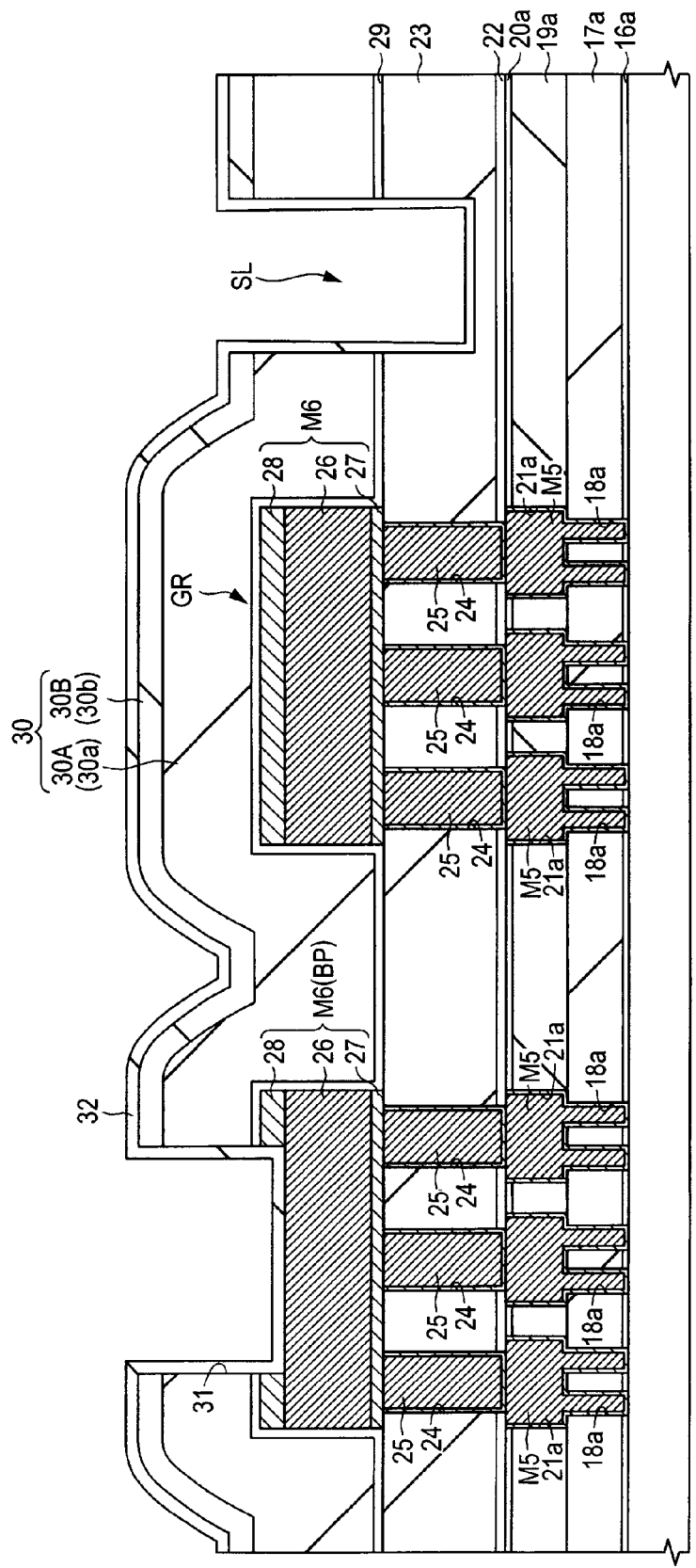
FIG. 10 is a sectional view of the same regions in a step subsequent to the step illustrated in FIG. 9.

Next, as illustrated in FIG. 10, the second passivation film 32 (described just above) is formed over the main surface of the semiconductor substrate 1. The second passivation film 32 is, for example, a silicon nitride film formed by plasma CVD, and the thickness thereof is, for example, from about 100 to 300 nm. The second passivation film 32 covers the upper surface of the first passivation film 30, the inner walls (the side surface and the bottom surface) of the opening 31 for making the sixth-layer interconnection M6 used for the bonding pads BP naked, and the inner walls (the side surfaces and the bottom surface) of the slit SL, these surfaces being named or classified so when viewed from the above.

Figure 11:
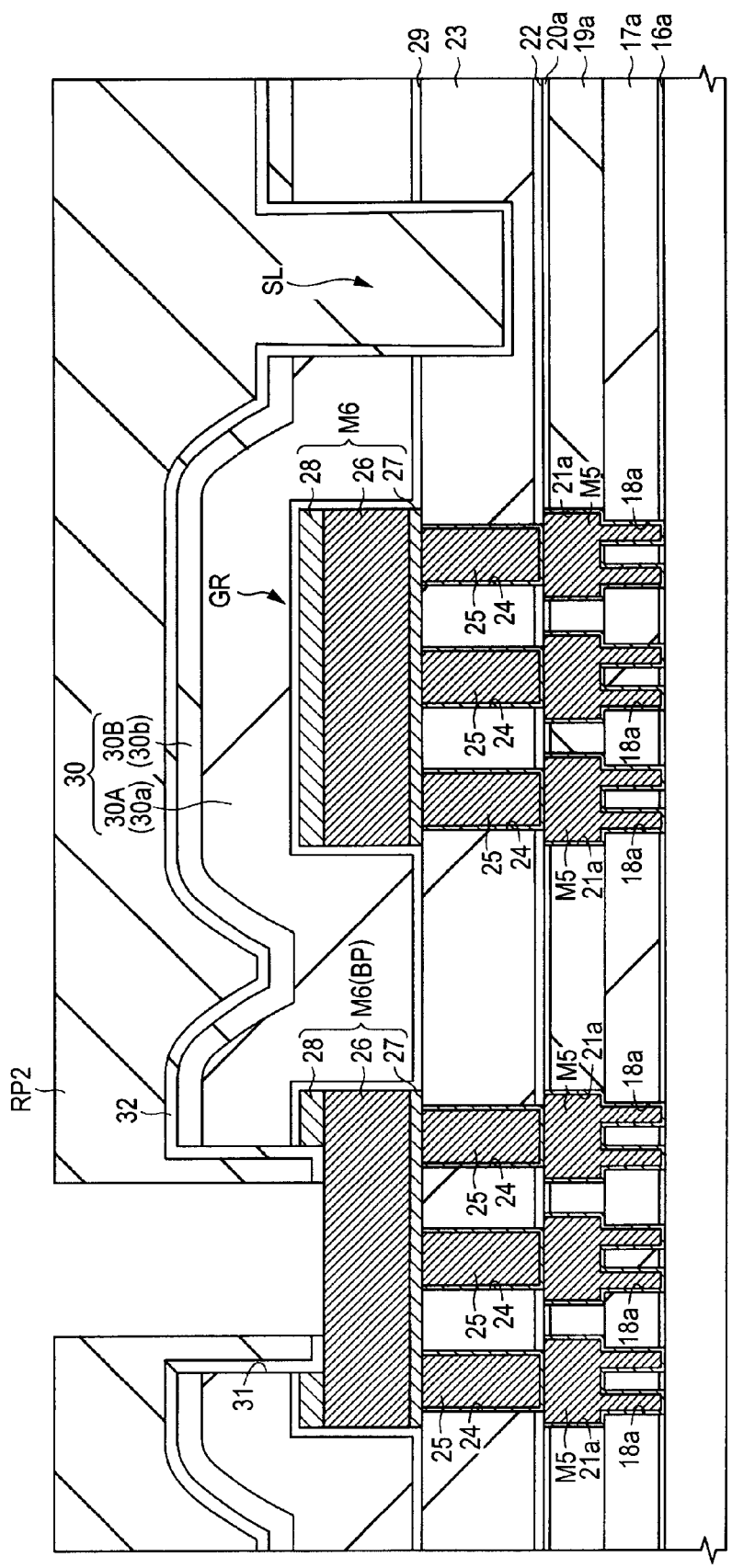
FIG. 11 is a sectional view of the same regions in a step subsequent to the step illustrated in FIG. 10.

Next, as illustrated in FIG. 11, a resist pattern RP2 is used to remove only the second passivation film 32 on the upper surface of the sixth-layer interconnection M6 used for the bonding pads BP, thereby making the Al film 26 of the sixth-layer interconnection M6 naked. In this step, the passivation film 32 on the side surface of the opening 31 is not removed and the TiN film 28 is covered with the second passivation film 32. The covering of the TiN film 28 with the second passivation film 32 makes it uneasy to oxidize the TiN film 28 so that an expansion in the volume of the TiN film 28 through oxidization is not easily caused. In this way, the first passivation film 30, the interlayer dielectric 23, and so on are not cracked so that the invasion of water through cracks can be prevented. As a result, a corrosion of the Cu interconnections in each of the element formation regions can be prevented. In this step, the second passivation film 32 formed on the inner walls (the side surfaces and the bottom surface) of the slit SL is not removed, either. In this way, the invasion of water through the slit SL can be prevented. Thus, a corrosion of the Cu interconnections in the element formation region can be prevented.

As described above, in the first embodiment, the slit SL is formed to cause the bottom of the slit SL not to penetrate through the barrier insulating film 22, and subsequently the inner walls (the side surfaces and the bottom surface) of the slit SL are covered with the second passivation film 32. Moreover, the side surface of the opening 31, which is made to make the upper surface of the sixth-layer interconnection M6 used for the bonding pads BP naked, is covered with the second passivation film 32, thereby preventing the TiN film 28 formed on the upper surface of the Al film 26 from being made naked, so as to prevent the first passivation film 30, the interlayer dielectric 23, and so on from being cracked by an expansion in the volume of the TiN film 28 through oxidization. These matters make it possible to prevent, in a reliability test for the semiconductor device, the invasion of water into the element formation region through the slit SL or cracks. Thus, a corrosion of the Cu interconnections in the element formation region, which is caused by water, is not generated so that a fall in the reliability of the semiconductor can be prevented.

Second Embodiment

In the first embodiment, the inner walls (the side surfaces and the bottom surface) of the slit SL made to surround the circumference of the guard ring GR are covered with the second passivation film 32, thereby preventing water from invading the element formation region through the slit SL. Moreover, the side surface of the opening 31, which is made to make the upper surface of the sixth-layer interconnection M6 used for the bonding pads BP naked, is covered with the second passivation film 32, thereby preventing the TiN film 28 from being made naked, so as to prevent the first passivation film 30 from being cracked by an expansion in the volume of the TiN film 28 through oxidization. In this way, the invasion of water into the element formation region through cracks is prevented.

In the second embodiment, a sixth-layer interconnection which is an interconnection of a top layer is covered with a first passivation film in the same way as in the first embodiment; however, the second embodiment is different from the first embodiment in the following: the inner walls (the side surfaces and the bottom surface) of each slit made to surround the circumference of a guard ring, and the side surface of each opening made to make the upper surface of the sixth-layer interconnection used for bonding pads naked are covered with an upper-layer passivation film which configures an upper-layer region of the first passivation film.

The semiconductor device of the second embodiment is described with reference to FIG. 12, which is a partial sectional view of the semiconductor device and illustrates upper-layer interconnections (equivalent to the above-mentioned fifth- and sixth-layer interconnections M5 and M6) of this semiconductor device. Various semiconductor elements formed in/over a main surface of a semiconductor substrate 1, and the structure of interconnections from a first-layer interconnection M1 to the sixth-layer interconnection M6 of the present device are the same as described in the first embodiment. Thus, a description thereof is omitted.

Figure 12:
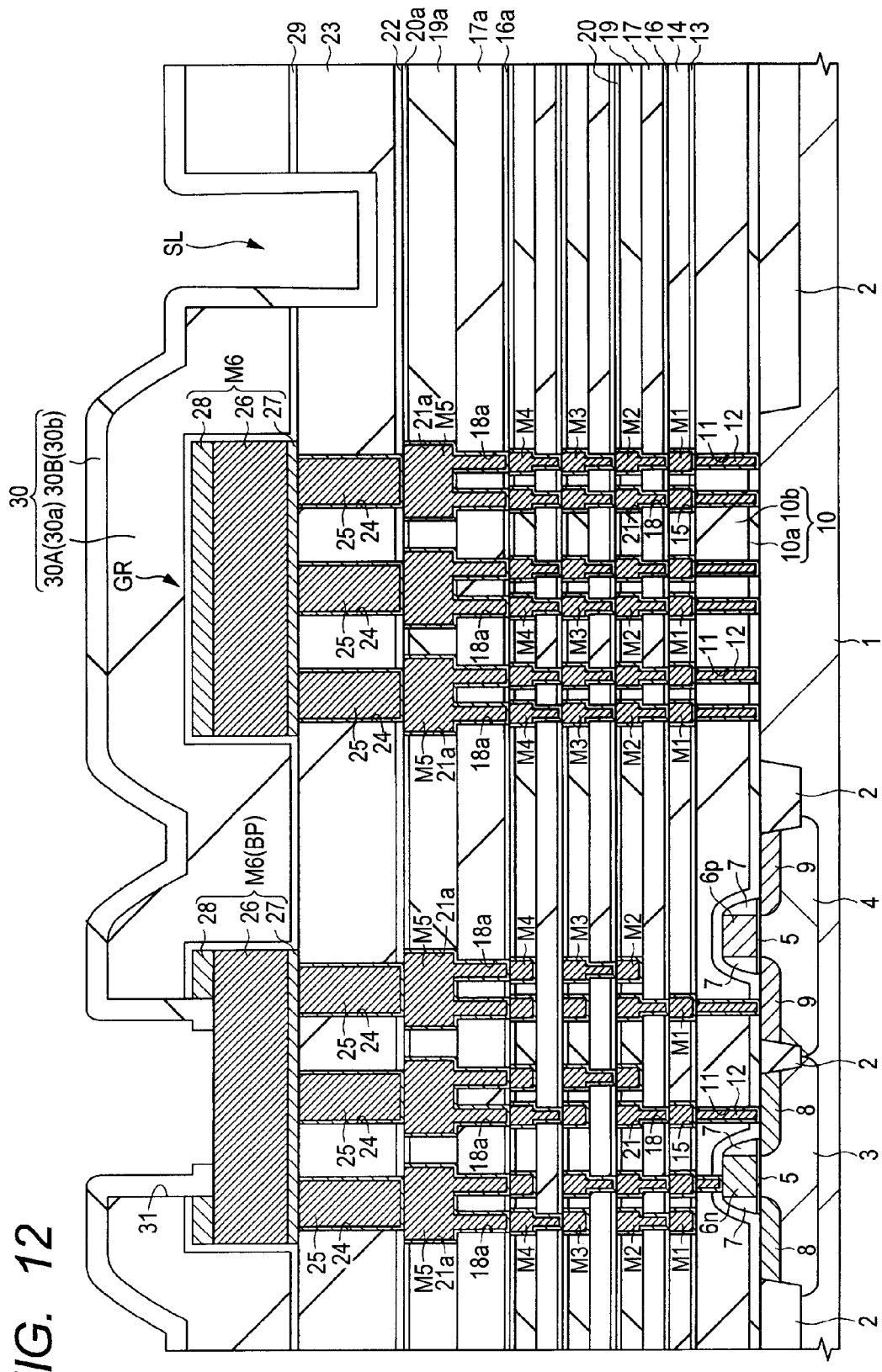
FIG. 12 is a partial sectional view of a semiconductor device according to a second embodiment of the invention.

As illustrated in FIG. 12, the sixth-layer interconnection M6 is covered with an insulating film 29 for bonding, and a first passivation film 30. The bonding insulating film 29 is, for example, a silicon oxide film formed by plasma CVD, and is laid to prevent the first passivation film 30 from being peeled. The thickness thereof is, for example, about 70 nm.

The first passivation film 30 is a laminated film comprised of a lower-layer passivation film 30A and an upper-layer passivation film 30B. The lower-layer passivation layer 30A is, for example, a silicon oxide film 30a formed by high-density plasma CVD. The upper-layer passivation film 30B is a protecting film having a function of preventing the invasion of water, and is, for example, a silicon nitride film 30b formed by plasma CVD. The thickness of the lower-layer passivation film 30A is, for example, about 1000 nm. The thickness of the upper-layer passivation film 30B is, for example, about 600 nm. The first passivation film 30 has a function as a protecting film for preventing the invasion of water or impurities from the outside, and restraining the penetration of α-rays.

In any element formation region, openings, a typical example of which is an opening 31, are made in a TiN film 28 as the top layer of the sixth-layer interconnection M6 used for the bonding pads BP, the bonding insulating film 29, and the lower-layer passivation film 30A. An Al film 26 of the sixth-layer interconnection M6 is exposed to the bottom surface of the opening 31.

A guard ring GR is formed to surround the circumference of the element formation region. A slit SL is made to surround the circumference of the guard ring GR. This slit SL is made in an interlayer dielectric 23 laid between the fifth- and the sixth-layer interconnections M5 and M6, the bonding insulating film 29, and the lower-layer passivation film 30A. The bottom of the slit SL does not penetrate through the interlayer dielectric 23 in the film thickness direction of this film 23, so as not to reach a barrier insulating film 22 which is laid between the fifth- and the sixth-layer interconnections M5 and M6, and which has a function as a protecting film for preventing the diffusion of Cu. The width of the slit SL is, for example, from about 4 to 5 nm.

Furthermore, the upper-layer passivation film 30B covers the upper surface of the lower-layer passivation film 30A, the side surface of the opening 31 made to make the upper surface of the sixth-layer interconnection M6 used for the bonding pads BP naked, and the inner walls (the side surfaces and the bottom surface) of the slit SL, these surfaces being named or classified so when viewed from the above. Only the upper surface of the sixth-layer interconnection M6 used for the bonding pads BP is not covered with the upper-layer passivation film 30B, and is made naked in order to be coupled with external terminals (such as bonding wires or bumps).

As described above, by covering the inner walls (the side surfaces and the bottom surface) of the slit SL with the upper-layer passivation film 30B, water from the outside can be prevented from invading the element formation region through the slit SL. Moreover, by covering the side surface of the opening 31, which is made to make the upper surface of the sixth-layer interconnection M6 used for the bonding pads BP naked, with the upper-layer passivation film 30B, the first passivation film 30, the interlayer dielectric 23 and so on can be prevented from being cracked by an oxidization-caused expansion in the volume of the TiN film 28. Thus, the invasion of water into the element formation region through cracks can be prevented. These matters make it possible to prevent, in a reliability test for the semiconductor device, a corrosion of the Cu interconnections which is caused by the invasion of water in the element formation region through the slit SL, so as to prevent a fall in the reliability of the semiconductor device.

Figure 13:
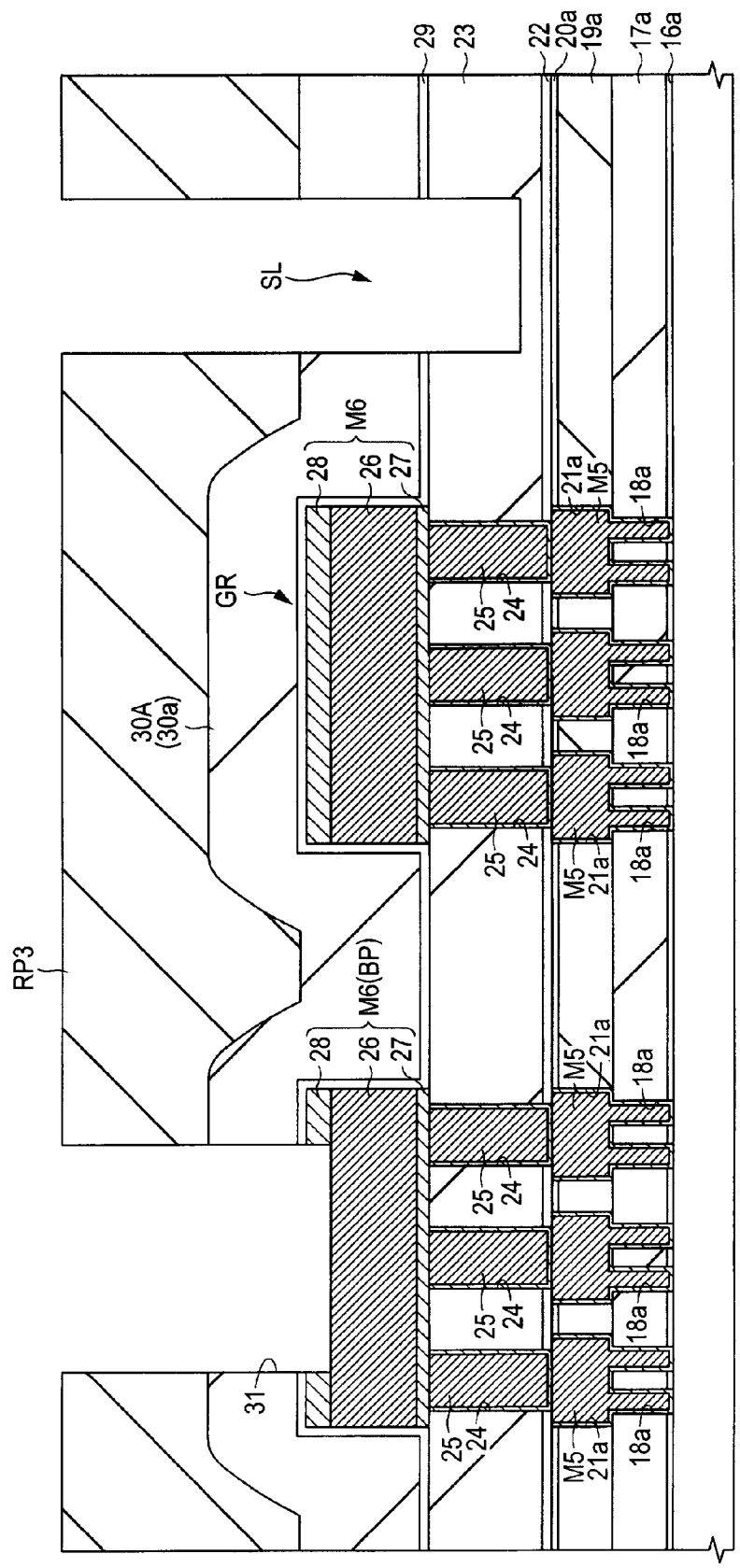
FIG. 13 is a partial sectional view of upper-layer interconnections of a workpiece of the semiconductor device according to the second embodiment to illustrate a step in a method for manufacturing this device.
Figure 14:
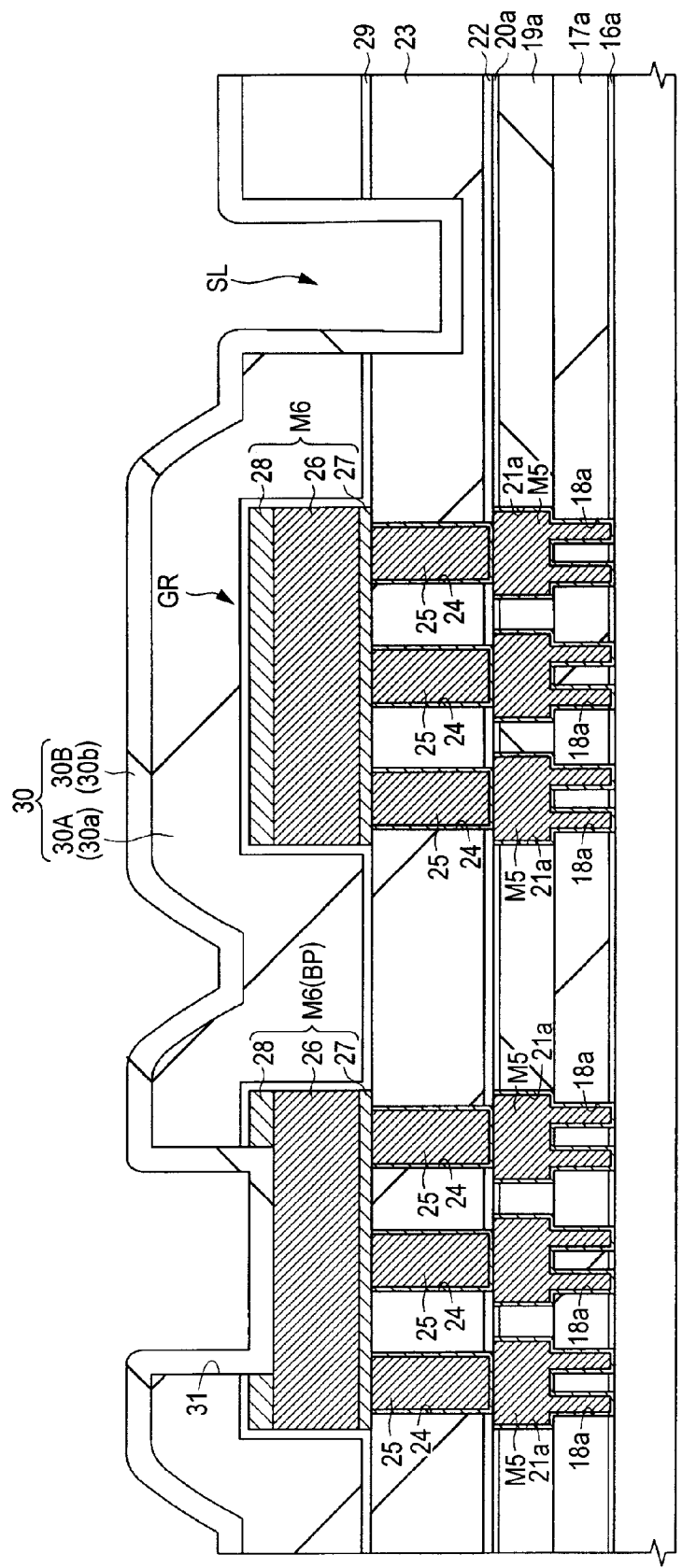
FIG. 14 is a sectional view of the same regions as illustrated in FIG. 13 in a step subsequent to the step illustrated in FIG. 13.
Figure 15:
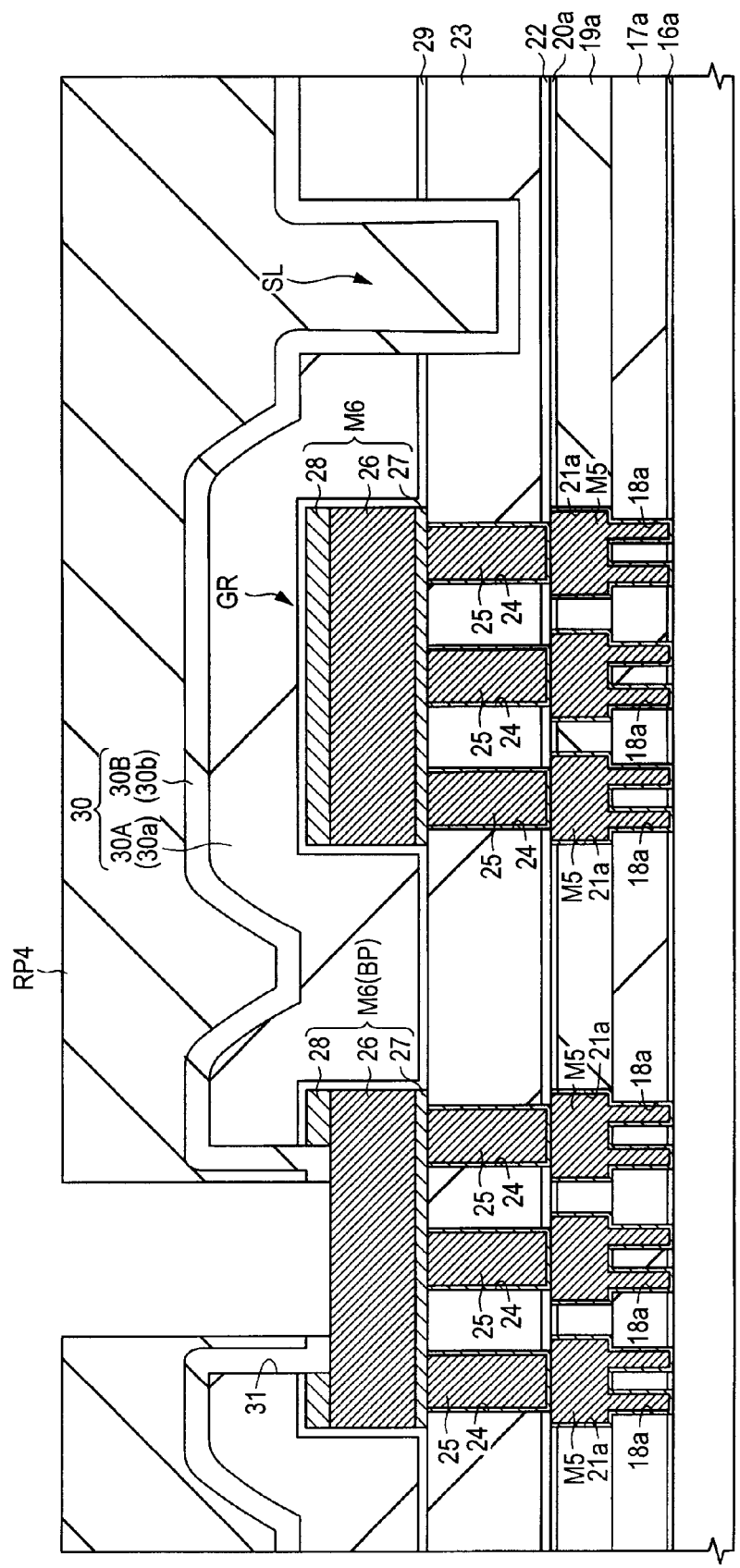
FIG. 15 is a sectional view of the same regions in a step subsequent to the step illustrated in FIG. 14.

The following describes a method for manufacturing the semiconductor device according to the second embodiment with reference to FIGS. 13 to 15. FIGS. 13 to 15 are each a partial sectional view illustrating upper-layer interconnections (equivalent to the above-mentioned fifth- and sixth-layer interconnections M5 and M6) of this semiconductor device or a workpiece thereof. Steps of forming various semiconductor elements in/over a main surface of a semiconductor substrate 1, and then forming interconnections from a first-layer interconnection M1 to a sixth-layer interconnection M6 of the present device are the same as described about the first embodiment. Thus, a description thereof is omitted.

Subsequently to the same manufacturing steps as described with reference to FIG. 7 about the first embodiment, the following is first conducted as illustrated in FIG. 13: etching using a resist pattern RP3 as a mask is utilized to etch the lower-layer passivation film 30A on the upper surface of the sixth-layer interconnection M6 used for bonding pads BP, the bonding insulating film 29 and the TiN film 28 successively. Simultaneously, in each slit region, the lower-layer passivation film 30A, the bonding insulating film 29, and the interlayer dielectric 23 are successively etched. In this way, in each element formation region, openings, a typical example of which is an opening 31, are made through which the sixth-layer interconnection M6 used for the bonding pads BP is naked. In the slit region, a slit SL which does not reach the barrier insulating film 22 is made.

The Al film 26 which partially configures the sixth-layer interconnection M6 is exposed to the bottom surface of the opening 31. The TiN film 28 formed on the upper surface of the Al film 26 is also exposed to the side surface of the opening 31. About the slit SL, the depth thereof is varied by a variation in the precision of working for making the slit SL, or some other factor. However, the slit SL is formed in such a manner that the bottom thereof is kept in the barrier insulating film 22 so that the slit SL does not penetrate through the barrier insulating film 22.

Next, as illustrated in FIG. 14, an upper-layer passivation film 30B is formed on the lower-layer passivation film 30A. The upper-layer passivation film 30B is a protecting film having a function of preventing the invasion of water, and is, for example, a silicon nitride film formed by plasma CVD. The thickness thereof is, for example, about 600 nm. The upper-layer passivation film 30B covers the upper surface of the lower-layer passivation film 30A, the inner walls (the side surface and the bottom surface) of the opening 31 made to make the sixth-layer interconnection M6 used for the bonding pads BP naked, and the inner walls (the side surfaces and the bottom surface) of the slit SL, these surfaces being named or classified so when viewed from the above.

Next, as illustrated in FIG. 15, a resist pattern RP4 is used as a mask to remove only the upper-layer passivation film 30B on the upper surface of the sixth-layer interconnection M6 used for the bonding pads BP, thereby making the Al film 26 of the sixth-layer interconnection M6 naked. In this step, the upper-layer passivation film 30B on the side surface of the opening 31 is not removed and the TiN film 28 exposed to the side surface of the opening 31 is covered with the upper-layer passivation film 30B. The covering of the TiN film 28 with the upper-layer passivation film 30B makes it uneasy to oxidize the TiN film 28 so that an expansion in the volume of the TiN film 28 through oxidization is not easily caused. In this way, the first passivation film 30, the interlayer dielectric 23, and so on are not cracked so that the invasion of water through cracks can be prevented. As a result, a corrosion of the Cu interconnections in the element formation region can be prevented. In this step, the upper-layer passivation film 30B formed on the inner walls (the side surfaces and the bottom surface) of the slit SL is not removed, either. In this way, the invasion of water through the slit SL can be prevented. Thus, a corrosion of the Cu interconnections in the element formation region can be prevented.

As described above, according to the second embodiment, the invasion of water into the element formation region from the outside can be prevented so that the same advantageous effects as manufactured by the first embodiment can be obtained. Furthermore, in the first embodiment, the second passivation film 32 is formed; however, in the second embodiment, the second passivation film 32 is not formed. Thus, in the second embodiment, material costs therefor can be made lower and the manufacturing period can be made shorter than in the first embodiment.

Third Embodiment

A semiconductor device according to present the third embodiment is described with reference to FIGS. 16 and 17.

Figure 16:
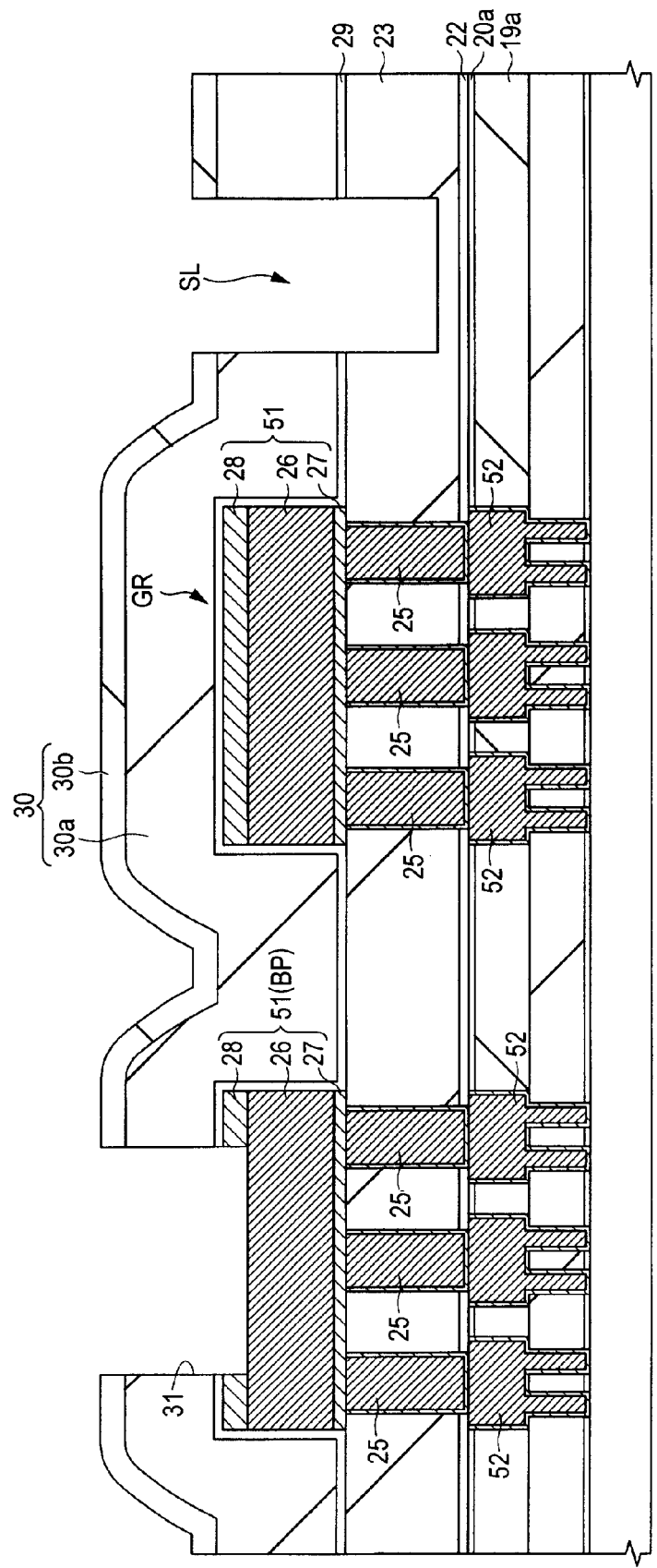
FIG. 16 is a partial sectional view of an example of a semiconductor device according to the third embodiment of the invention.

A description is first made about an example of the semiconductor device according to the third embodiment with reference to FIG. 16, which is a partial sectional view of this device example and illustrates upper-layer interconnections (corresponding to the above-mentioned fifth- and sixth-layer interconnections M5 and M6) in an element formation region and a slit region of the device example.

As illustrated in FIG. 16, a sixth-layer interconnection M6 is covered with an insulating film 29 for bonding, and a first passivation film 30. The bonding insulating film 29 is, for example, a silicon oxide film formed by plasma CVD, and is laid to prevent the first passivation film 30 from being peeled. The thickness thereof is, for example, about 70 nm.

The first passivation film 30 is a laminated film comprised of a lower-layer passivation film 30a and an upper-layer passivation film 30b. The lower-layer passivation layer 30a is, for example, a silicon oxide film formed by high-density plasma CVD. The upper-layer passivation film 30b is a protecting film having a function of preventing the invasion of water, and is, for example, a silicon nitride film formed by plasma CVD. The thickness of the lower-layer passivation film 30a is, for example, about 1000 nm. The thickness of the upper-layer passivation film 30b is, for example, about 600 nm. The first passivation film 30 has a function as a protecting film for preventing the invasion of water or impurities from the outside, and restraining the penetration of α-rays.

In the element formation region (illustrated in FIG. 16), openings, a typical example of which is an opening 31, are made in a TiN film 28 as the upper layer of the sixth-layer interconnection M6 used for the bonding pads BP, the bonding insulating film 29, and the lower-layer passivation film 30a. An Al film 26 of the sixth-layer interconnection M6 is exposed to the bottom surface of the opening 31.

A guard ring GR is formed to surround the circumference of the element formation region. A slit SL is made to surround the circumference of the guard ring GR. This slit SL is made in an interlayer dielectric 23 laid between the fifth- and the sixth-layer interconnections M5 and M6, the bonding insulating film 29, and the lower-layer passivation film 30a. The bottom of the slit SL does not penetrate through the interlayer dielectric 23 in the film thickness direction of this film 23, so as not to reach a barrier insulating film 22 which is laid between the fifth- and the sixth-layer interconnections M5 and M6, and which has a function as a protecting film for preventing the diffusion of Cu. The width of the slit SL is, for example, from about 4 to 5 nm.

Figure 17:
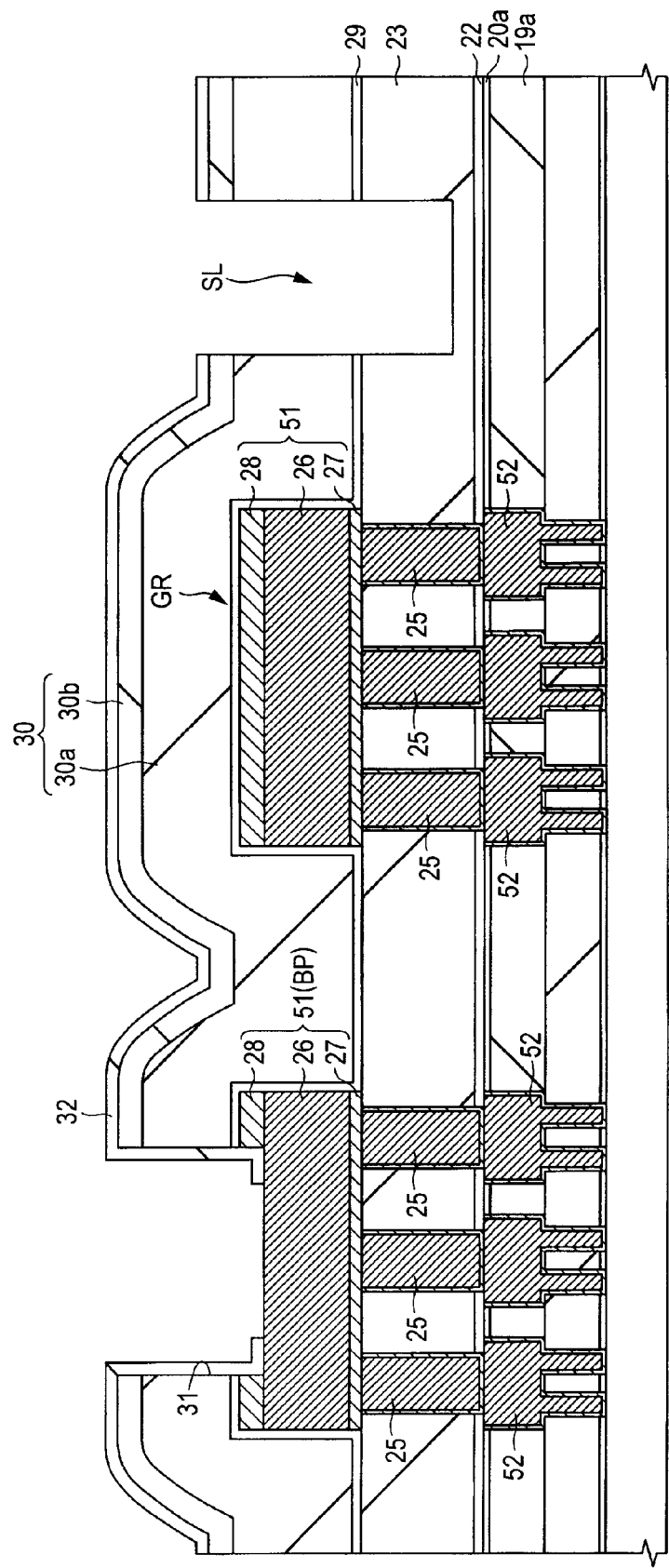
FIG. 17 is a partial sectional view of another example of the semiconductor device according to a third embodiment.

Next, a description is made about another example of the semiconductor device according to the third embodiment with reference to FIG. 17, which is a partial sectional view of this device example and illustrates upper-layer interconnections (corresponding to the above-mentioned fifth- and sixth-layer interconnections M5 and M6) in an element formation region and a slit region of the device example.

As illustrated in FIG. 17, the semiconductor device of this example has the same upper-layer interconnection structure as illustrated in FIG. 16. Additionally, a second passivation film 32 covers the upper surface of a first passivation film 30, the side surfaces of openings, a typical example of which is an opening 31, that are made (in the element formation region) to make the upper surface of a sixth-layer interconnection M6 used for bonding pads BP naked, and the inner walls (the side surfaces and the bottom surface) of a slit SL, these surfaces being named or classified so when viewed from the above. Only the upper surface of the sixth-layer interconnection M6 used for the bonding pads BP is not covered with the second passivation film 32, and is made naked in order to be coupled with external terminals (such as bonding wires or bumps).

As described above, according to the third embodiment, even when its interconnection-forming insulating film 19a is a low-k film which water easily invades, the bottom of the slit SL does not penetrate the interlayer dielectric 23 in the film thickness direction of this film 23 so as not to reach the interconnection-forming insulating film 19a. Thus, the invasion of water into the element formation region through the slit SL can be prevented.

The above has specifically described the embodiments made by the inventors. However, the invention is not limited to these embodiments. Thus, it is needless to say that the embodiments may be varied or modified in various forms as far as the variations or modifications do not depart from the subject matter of the invention.

The invention may be applied to a semiconductor device having a slit (such as a trench or a trench pattern) made over a main surface of a semiconductor substrate so as to surround each element formation region, in order to prevent its interlayer dielectric, its interconnections and so on from being peeled.

What is claimed is:
1. A semiconductor device, comprising:
a first insulating film formed over a semiconductor substrate;
an interconnection trench made in the first insulating film;

a first interconnection formed inside the interconnection trench and comprising a first conductive film containing copper as a main conductive material;
a second insulating film formed over the first interconnection and the first insulating film and having a first thickness;
a third insulating film formed over the second insulating film and having a second thickness larger than the first thickness;
a plug formed in the second and third insulating films so as to be coupled with the first interconnection and comprising a main conductive material different from that of the first conductive film;
a second interconnection formed so as to be coupled with the plug and comprising a main conductive material different from that of the first conductive film;
a first passivation film formed to cover the second interconnection and the third insulating film;
an opening made in the first passivation film to expose the upper surface of the second interconnection;
a trench made in the third insulating film and the first passivation film and between an element formation region and a dicing region; and
a second passivation film formed to cover any side surface of the opening,
wherein the bottom of the trench does not penetrate through the third insulating film in the film thickness direction of the third insulating film.

2. The semiconductor device according to claim 1, wherein the second passivation film is formed to cover any side surface and the bottom surface of the trench.

3. The semiconductor device according to claim 1, wherein the second insulating film is a silicon carbonitride film, and the bottom of the trench is positioned above the silicon carbonitride film.

4. The semiconductor device according to claim 1, wherein the bottom of the trench does not penetrate through the second insulating film in the film thickness direction of the second insulating film.

5. The semiconductor device according to claim 1, wherein the second insulating film is any one selected from the group consisting of a silicon carbonitride film, a silicon oxynitride film and a silicon nitride film, and the third insulating film is a silicon oxide film.

6. The semiconductor device according to claim 1, wherein the second passivation film is a silicon nitride film.

7. The semiconductor device according to claim 1, wherein the dielectric constant of the first insulating film is lower than that of $SiO_2$.

8. A semiconductor device, comprising:
a first insulating film formed over a semiconductor substrate;
an interconnection trench made in the first insulating film;
a first interconnection formed inside the interconnection trench and comprising a first conductive film containing copper as a main conductive material;
a second insulating film formed over the first interconnection and the first insulating film and having a first thickness;
a third insulating film formed over the second insulating film and having a second thickness larger than the first thickness;
a plug formed in the second and third insulating films so as to be coupled with the first interconnection and comprising a main conductive material different from that of the first conductive film;
a second interconnection formed so as to be coupled with the plug and comprising a main conductive material different from that of the first conductive film;
a first passivation film having a laminated structure of a lower-layer film and an upper-layer film and formed to cover the second interconnection and the third insulating film;
an opening made in the first passivation film to expose the upper surface of the second interconnection;
a trench made in the third insulating film and the first passivation film and between an element formation region and a dicing region; and
a second passivation film formed to cover any side surface of the opening and any side surface and the bottom surface of the trench,
wherein the upper-layer film of the first passivation film, and the second passivation film are each a silicon nitride film.

9. The semiconductor device according to claim 8, wherein the bottom of the trench is positioned inside the third insulating film.

10. The semiconductor device according to claim 8, wherein the second insulating film is a silicon carbonitride film, and the bottom of the trench is positioned above the silicon carbonitride film.

11. The semiconductor device according to claim 8, wherein the bottom of the trench does not penetrate through the second insulating film in the film thickness direction of the second insulating film.

12. The semiconductor device according to claim 8, wherein the second insulating film is any one selected from the group consisting of a silicon carbonitride film, a silicon oxynitride film and a silicon nitride film, and the third insulating film is a silicon oxide film.

13. The semiconductor device according to claim 8, wherein the dielectric constant of the first insulating film is lower than that of $SiO_2$.

* * * * *